US012685148B2

(12) United States Patent
Hsiao et al.

(10) Patent No.:  US 12,685,148 B2
(45) Date of Patent:         Jul. 14, 2026

(54) DUMMY METAL-INSULATOR-METAL STRUCTURES WITHIN VIAS

(71) Applicant: Taiwan Semiconductor Manufacturing Company, Ltd., Hsin-Chu (TW)

(72) Inventors: Yuan-Yang Hsiao, Taipei (TW); Hsiang-Ku Shen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 790 days.

(21) Appl. No.: 17/901,352

(22) Filed: Sep. 1, 2022

(65) Prior Publication Data

US 2023/0352396 A1      Nov. 2, 2023

Related U.S. Application Data

(60) Provisional application No. 63/337,502, filed on May 2, 2022.

(51) Int. Cl.

| | |
|---|---|
| *H10W 20/42* | (2026.01) |
| *H01G 4/005* | (2006.01) |
| *H01G 4/08* | (2006.01) |
| *H01G 4/232* | (2006.01) |
| *H01G 4/33* | (2006.01) |
| *H10D 1/00* | (2025.01) |
| *H10D 1/68* | (2025.01) |
| *H10W 20/40* | (2026.01) |

(52) U.S. Cl.
CPC ............ *H10W 20/496* (2026.01); *H01G 4/08* (2013.01); *H10D 1/042* (2025.01); *H10D 1/716* (2025.01); *H10W 20/42* (2026.01)

(58) Field of Classification Search
CPC   H01G 4/08; H01G 4/232; H01G 4/38; H01G 4/005; H01G 4/33; H01G 4/385; H01L 23/5223; H01L 23/5226; H10D 1/042; H10D 1/716; H10D 1/692; H10W 20/496; H10W 20/42; H10W 20/083
See application file for complete search history.

(56) References Cited

U.S. PATENT DOCUMENTS 6,437,385 B1 *   8/2002   Bertin .................. H10B 12/038
                                                   257/E21.651
2013/0270675 A1   10/2013   Childs
(Continued)

*Primary Examiner* — Omar F Mojaddedi
(74) *Attorney, Agent, or Firm* — HAYNES AND BOONE, LLP

(57) ABSTRACT

Via array configurations for metal-insulator-metal (MIM) capacitor structures are disclosed herein. An exemplary MIM capacitor structure includes a capacitor bottom metal layer, a first dielectric layer over the capacitor bottom metal layer, a capacitor middle metal layer over the first dielectric layer, a second dielectric layer over the capacitor middle metal layer, and a capacitor top metal layer over the second dielectric layer. A metal via array, which has a first metal via and a second metal via, is connected to the capacitor top metal layer and the capacitor bottom metal layer. A portion of the capacitor top metal layer covers an area of the second dielectric layer extending from the first metal via to the second metal via. From a top view, the portion of the capacitor top metal layer surrounds the first metal via and the second metal via.

20 Claims, 23 Drawing Sheets

(56)          References Cited

U.S. PATENT DOCUMENTS

| | | | |
|---|---|---|---|
| 2014/0159200 A1* | 6/2014 | Loke | H10W 20/496 |
| | | | 257/532 |
| 2015/0145103 A1* | 5/2015 | Chou | H10D 1/665 |
| | | | 438/387 |
| 2017/0018550 A1* | 1/2017 | Shih | H10D 1/692 |
| 2019/0305078 A1* | 10/2019 | Wu | H10D 1/042 |
| 2022/0384563 A1* | 12/2022 | Kim | H10D 1/694 |

* cited by examiner

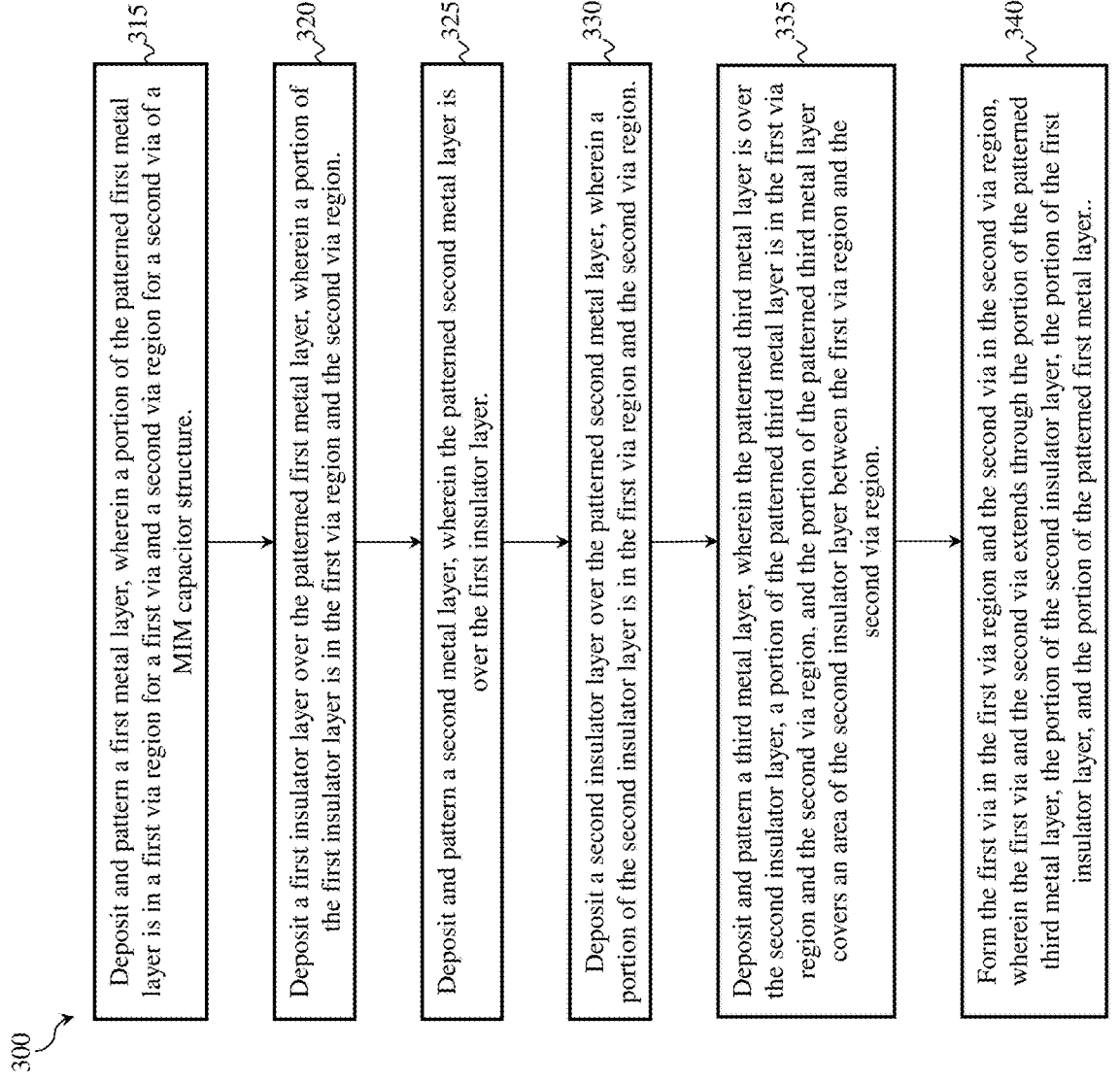

300

315
Deposit and pattern a first metal layer, wherein a portion of the patterned first metal layer is in a first via region for a first via and a second via region for a second via of a MIM capacitor structure.

320
Deposit a first insulator layer over the patterned first metal layer, wherein a portion of the first insulator layer is in the first via region and the second via region.

325
Deposit and pattern a second metal layer, wherein the patterned second metal layer is over the first insulator layer.

330
Deposit a second insulator layer over the patterned second metal layer, wherein a portion of the second insulator layer is in the first via region and the second via region.

335
Deposit and pattern a third metal layer, wherein the patterned third metal layer is over the second insulator layer, a portion of the patterned third metal layer is in the first via region and the second via region, and the portion of the patterned third metal layer covers an area of the second insulator layer between the first via region and the second via region.

340
Form the first via in the first via region and the second via in the second via region, wherein the first via and the second via extends through the portion of the patterned third metal layer, the portion of the second insulator layer, the portion of the first insulator layer, and the portion of the patterned first metal layer..

FIG. 23

DUMMY METAL-INSULATOR-METAL STRUCTURES WITHIN VIAS

This application is a non-provisional application of and claims benefit of U.S. Provisional Patent Application Ser. No. 63/337,502, filed May 2, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as geometry sizes of semiconductor devices decrease, passive devices, which sometimes consume large surface areas, are moved to back-end-of-line (BEOL) structures. Metal-insulator-metal (MIM) capacitors are an example of such passive devices. A typical MIM capacitor includes multiple conductor plate layers that are insulated from one another by multiple insulator layers. Various contact vias are connected to and/or extend through one or more of the multiple conductor plate layers of the MIM capacitor. Although existing configurations of contact via areas of MIM structures are generally adequate for their intended purposes, improvements are needed as IC technologies scale.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 23 is a flow chart of a method for fabricating a MIM structure having an enhanced via structures according to various aspects of the present disclosure.

DETAILED DESCRIPTION

Figures 1A, 1B:
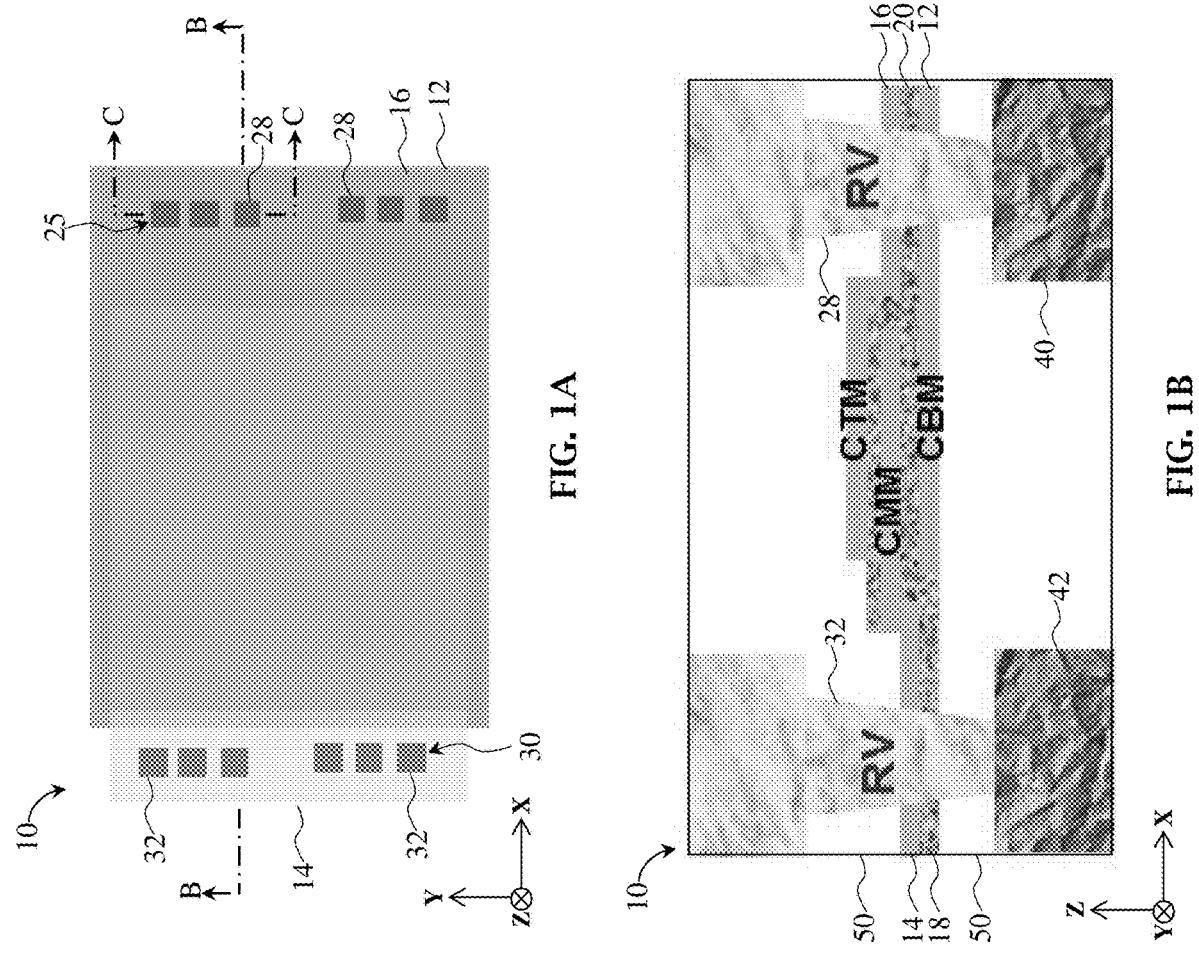
FIG. 1A and FIG. 1B are fragmentary diagrammatic views of a metal-insulator-metal (MIM) capacitor, in portion or entirety, according to various aspects of the present disclosure.

The present disclosure relates generally to integrated circuit (IC) devices and/or semiconductor devices, and more particularly, to metal-insulator-metal (MIM) capacitors.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-insulator-metal (MIM) capacitors have been widely used in functional circuits, such as mixed signal circuits, analog circuits, radio frequency (RF) circuits, dynamic random-access memories (DRAMs), embedded DRAMs, logic circuits, other circuits, or combinations thereof. In system-on-chip (SOC) applications, different capacitors for different functional circuits may be integrated on a same chip to serve different purposes. For example, for mixed-signal circuits, capacitors are used for decoupling and/or as high-frequency noise filters. For DRAM circuits and embedded DRAM circuits, capacitors are used for memory storage, while for RF circuits, capacitors are used in oscillators and phase-shift networks for coupling and/or bypassing purposes. For microprocessors, capacitors are used for decoupling.

FIG. 1A is a fragmentary diagrammatic top view of a MIM capacitor 10, in portion or entirety, according to various aspects of the present disclosure. FIG. 1B is a fragmentary diagrammatic cross-sectional view of MIM capacitor 10, in portion or entirety, along a line B-B of FIG. 1A according to various aspects of the present disclosure. As its name suggests, MIM capacitor includes a sandwich structure of interleaving metal layers and insulator layers. In FIG. 1A and FIG. 1B, MIM capacitor 10 includes a bottom conductor plate layer (CBM and/or MIM1) 12, a middle conductor plate layer (CMM and/or MIM2) 14 over bottom conductor plate layer 12, and a top conductor plate layer (CTM and/or MIM3) 16 over middle conductor plate layer 14, each of which is insulated from an adjacent conductor plate layer by a dielectric layer, such as a high-k dielectric layer. For example, MIM capacitor 10 includes a dielectric layer 18 between bottom conductor plate layer 12 and middle conductor plate layer 14 and a dielectric layer 20 between middle conductor plate layer 14 and top conductor plate layer 16. In some embodiments, MIM capacitor 10 includes additional conductor plate layers over top conductor plate layer 16, such as another top conductor plate layer (e.g., MIM4).

MIM capacitor 10 further includes a via array 25, which includes contacts/vias 28, and a via array 30, which includes contacts/vias 32. Via array 25 is spaced from via array 30 along the x-direction, vias 28 form a via column along the y-direction and are spaced from one another along the y-direction, and vias 32 form a via column along the y-direction and are spaced from one another along the y-direction. Middle conductor plate layer 14 is shifted laterally relative to top conductor plate layer 16 and bottom conductor plate layer 12 14, such that vias 28 extend through top conductor plate layer 16 and bottom conductor plate layer 12 (e.g., vias 28 are CTM/CBM redistribution vias), while vias 32 extend through middle conductor plate layer 14 (e.g., vias 32 are CMM redistribution vias). Vias 28 and vias 32 further extend through dielectric layer 18 and dielectric layer 20. One or more of vias 28 may extend to a respective contact 40 (e.g., a metal line), and one or more of vias 32 may extend to a respective contact 42 (e.g., a metal line). Bottom conductor plate layer 12, middle conductor plate layer 14, top conductor plate layer 16, dielectric layer 18, dielectric layer 20, via array 25 (including vias 28), via array 30 (including vias 32), contact(s) 40, and contact(s) 42 may be disposed in one or more dielectric layers 50 and/or passivation layers. FIG. 1A and FIG. 1B have been simplified for the sake of clarity to better understand the inventive concepts of the present disclosure. Additional features can be added in the via array, and some of the features described below can be replaced, modified, or eliminated in other embodiments of the via array.

In some cases, stress may be induced on a MIM capacitor, such as MIM capacitor 10, by surrounding layers and/or features (e.g., such as dielectric layer 50, vias 28, and vias 32). As a result, the MIM capacitor may be damaged. In some examples, the induced stress may form cracks that can propagate to the MIM capacitor. Patterns of bottom conductor plate layer, middle conductor plate layer, and top conductor plate layer in contact via areas, such as areas including via array 25 and/or via array 30, are sometimes configured substantially the same to reduce such stress and/or cracking. For example, patterns of bottom conductor plate layer and top conductor plate layer in contact via areas for CTM/CBM vias are configured so that CTM/CBM vias extend through a same number of layers and/or materials. Each CTM/CBM via may extend through a respective portion of top conductor plate layer(s). In other words, CTM/CBM vias may extend through portions of top conductor plate layer(s) that are not connected to one another. In some embodiments, such portions are considered dummy conductor layers (also referred to as dummy conductor pads). It has been observed that configuring CTM/CBM vias with independent portions of top conductor plate layer(s) may leave underlying dielectric layers exposed to subsequent processing. The exposed, underlying dielectric layers (e.g., dielectric layer 20) may be damaged and/or unintentionally thinned during patterning of overlying conductor layers, especially where the MIM capacitor includes more than multiple top conductor plate layers, such as MIM3 layers and MIM4 layers. To reduce an area of exposed, underlying dielectric layer in contact via areas of a MIM structure, the present disclosure proposes merging top conductor plate layers(s) through which adjacent contact vias of the MIM structure extend. In such embodiments, a dielectric layer extending between adjacent contact vias is covered by the merged top conductor plate layer(s). Details of the proposed via array configurations for MIM structures are described herein in the following pages.

FIGS. 2-18 are fragmentary diagrammatic cross-sectional views of a device 100, in portion or entirety, at various stages of fabrication of a MIM structure thereof according to various aspects of the present disclosure. FIGS. 2-18 depict cross-sectional view of device 100 in an X-Z plane, such as cross-sectional views of device 100 along lines that correspond with line B-B of FIG. 1A. FIGS. 2-18 have been simplified for the sake of clarity to better understand the inventive concepts of the present disclosure. Additional features can be added in device 100, and some of the features described below can be replaced, modified, or eliminated in other embodiments of device 100.

Figure 2:
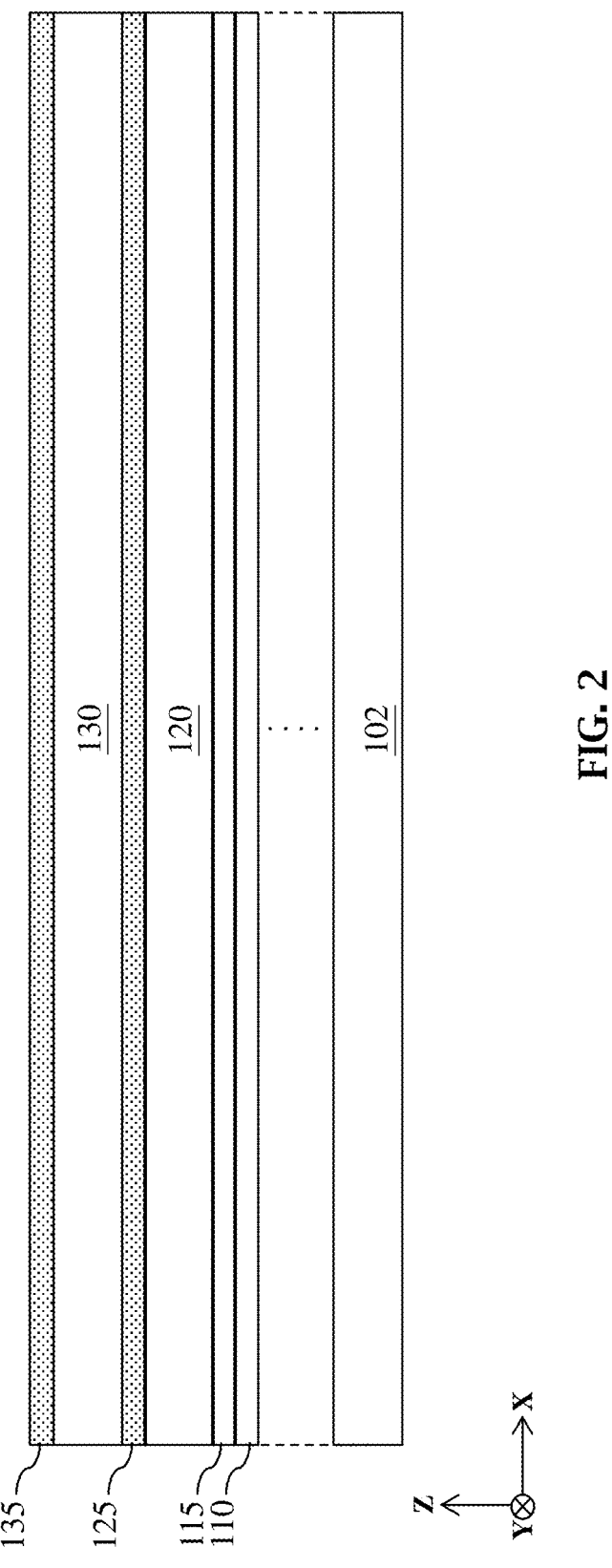
FIGS. 2-18 are fragmentary diagrammatic cross-sectional views of a device 100, in portion or entirety, at various stages of fabrication of a MIM capacitor structure thereof according to various aspects of the present disclosure.

Turing to FIG. 2, one or more dielectric layers are formed over a device substrate 102. In some embodiments, device substrate 202 is and/or includes a semiconductor substrate (wafer), such as a silicon substrate. The semiconductor substrate includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as SiGe, GaAsP, AlInAs, AlGaAs, GaInAs, GaInP, GaInAsP, or combinations thereof; or combinations thereof. In some embodiments, semiconductor substrate is a semiconductor-on-insulator substrate, such as a silicon-on-insulator (SOI) substrate, a silicon germanium-on-insulator (SGOI) substrate, or a germanium-on-insulator (GOI) substrate. The semiconductor substrate may include various doping configurations depending on design requirements as is known in the art.

In some embodiments, device substrate 102 includes a device layer DL and a multilayer interconnect MLI disposed over device layer DL. In some embodiments, device layer DL can include circuitry fabricated thereon and/or thereover by front-end-of-line (FEOL) processing and multilayer interconnect MLI can include circuitry fabricated on and/or over device layer DL by middle-of-line (MOL) processing and/or back-end-of-line BEOL) processing. Device substrate 102 can include various device components/features, such as a semiconductor substrate, doped wells (e.g., n-wells and/or p-wells), isolation features (e.g., shallow trench isolation (STI) structures and/or other suitable isolation structures), metal gates (for example, a metal gate having a gate electrode over a gate dielectric), gate spacers along sidewalls of the metal gates, source/drain features (e.g., epitaxial source/drains), other suitable device components, or combinations thereof. Device substrate 102 can include various passive microelectronic devices and active devices, such as resistors, capacitors, inductors, diodes, p-type field effect transistors (PFETs), n-type FETs (NFETs), metal-oxide semiconductor (MOS) FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors can be configured as planar transistors or non-planar transistors (e.g., FinFETs and/or gate-all-around (GAA) transistors) depending on design requirements.

Multilayer interconnect MLI can electrically connect devices of device layer DL, components of device layer DL, devices (e.g., a MIM capacitor) within multilayer interconnect MLI, components of multilayer interconnect MLI, or combinations thereof, such that the various devices and/or components can operate as specified by design requirements of device 100. Multilayer interconnect MLI includes a combination of dielectric layers and electrically conductive layers (e.g., patterned metal layers formed by conductive lines, conductive vias, conductive contacts, or combinations thereof) configured to form interconnect (routing) structures, which may provide interconnections (e.g., wiring) between the various devices and/or components of device 100. The conductive layers form vertical interconnect structures, such as device-level contacts and/or vias, that connect horizontal interconnect structures, such as conductive lines, in different layers/levels (or different planes) of multilayer interconnect Mil. In some embodiments, the interconnect structures route electrical signals between devices and/or components of device layer DL and/or multilayer interconnect MLI. In some embodiments, the interconnect structures distribute electrical signals (for example, clock signals, voltage signals, and/or ground signals) to the devices and/or the device components of device layer DL and/or multilayer interconnect MLI. In some embodiments, the conductive lines can include Cu, Al, AlCu, Ru, Co, other suitable electrically conductive material, or combinations thereof. In some embodiments, the contacts and/or the vias can include Cu, Al, AlCu, Ru, Co, W, other suitable electrically conductive material, or combinations thereof. In some embodiments, the dielectric layers can include silicon oxide or a silicon-and-oxygen containing material where silicon exists in various suitable forms. In some embodiments, the dielectric layers can include a low-k dielectric layer (e.g., having a dielectric constant less than that of $SiO_2$, which is about 3.9), such as tetraethylorthosilicate (TEOS) oxide, undoped silicate glass (USG), doped silicon oxide (e.g., borophosphosilicate glass (BPSG), fluorosilicate glass (FSG), phosphosilicate glass (PSG), boron doped silicon glass (BSG), other doped silicon oxide, or combinations thereof), other suitable low-k dielectric materials, or combinations thereof.

An interlayer dielectric (ILD) 110 is formed over substrate 102. ILD 110 includes silicon-and-oxygen containing material (e.g., silicon oxide) and/or low-k dielectric material layer, such as TEOS oxide, undoped silicate glass (USG), doped silicate glass (e.g., BPSG, FSG, PSG, BSG, or combinations thereof), other low-k dielectric material, or combinations thereof. ILD 110 can be deposited by chemical vapor deposition (CVD), physical vapor deposition (PVD), atomic layer deposition (ALD), other deposition process, or combinations thereof. In some embodiments, ILD 110 has a thickness of about 150 nm to about 130 nm (e.g., about 200 nm). ILD 110 may be conformally deposited and have a substantially uniform thickness.

A carbide layer 115 is formed over ILD 110. In some embodiments, carbide layer 115 is a silicon carbide (SiC) layer, although other types of carbide materials are contemplated by the present disclosure. Carbide layer 115 can be deposited by CVD, PVD, ALD, other deposition process, or combinations thereof. In some embodiments, carbide layer 115 has a thickness of about 45 nm to about 65 nm (e.g., 55 nm). In some embodiments, carbide layer 115 is conformally deposited and has a substantially uniform thickness.

A dielectric layer 120 is formed over carbide layer 115. Dielectric layer 120 can include a silicon-and-oxygen containing material (e.g., silicon oxide). In some embodiments, dielectric layer 120 includes undoped silicate glass (USG) and may be referred to as a USG layer. In some embodiments, dielectric layer 120 is a plasma-enhanced oxide (PEOX) USG (PEOX-USG) layer. Dielectric layer 120 can be deposited by plasma enhanced CVD (PECVD), high-density plasma CVD (HDP-CVD), sub-atmospheric CVD (SACVD), ALD, PVD, other deposition process, or combinations thereof. In some embodiments, dielectric layer 120 has a thickness of about 575 nm to about 675 nm (e.g., about 620 nm). In some embodiments, dielectric layer 120 is conformally deposited and has a substantially uniform thickness.

A dielectric layer 125 is formed over dielectric layer 120. Dielectric layer 125 can include a nitrogen-containing material and/or a carbon-containing material. For example, dielectric layer 125 includes silicon carbon nitride (SiCN), silicon oxycarbide (SiOC), silicon carbide (SiC), silicon oxycarbonitride (SiOCN), silicon nitride (SiN), other nitrogen-containing material and/or a carbon-containing material, or combinations thereof. In some embodiments, dielectric layer 125 is a silicon nitride layer. In some embodiments, dielectric layer 125 has a thickness of about 45 nm to about 55 nm (e.g., about 50 nm). Dielectric layer 125 can be deposited by CVD, ALD, PVD, other deposition process, or combinations thereof. Dielectric layer 125 may, in some embodiments, function as an etch stop layer (ESL).

A dielectric layer 130 may be deposited over dielectric layer 125. In some embodiments, dielectric layer 130 includes a silicon-and-oxygen containing material (e.g., silicon oxide). For example, dielectric layer 130 is a USG layer and/or a PEOX-USG layer. Dielectric layer 130 may be deposited by PECVD, HDP-CVD, SACVD, ALD, PVD, other deposition process, or combinations thereof. In some embodiments, dielectric layer 130 has a thickness of about 800 nm to about 1000 nm (e.g., 900 nm). In some embodiments, dielectric layer 130 is conformally deposited and has a substantially uniform thickness.

A hard mask layer 135 is formed over dielectric layer 130. In some embodiments, hard mask layer 135 includes a nitrogen-containing material. For example, hard mask layer 135 may be an SiON layer, although other types of hard mask materials are contemplated by the present disclosure. Hard mask layer 135 can be deposited by CVD, PVD, ALD, other deposition process, or combinations thereof. In some embodiments, hard mask layer 135 has a thickness of about 50 nm to about 70 nm (e.g., 60 nm). In some embodiments, hard mask layer 135 is conformally deposited and has a substantially uniform thickness.

Figure 3:
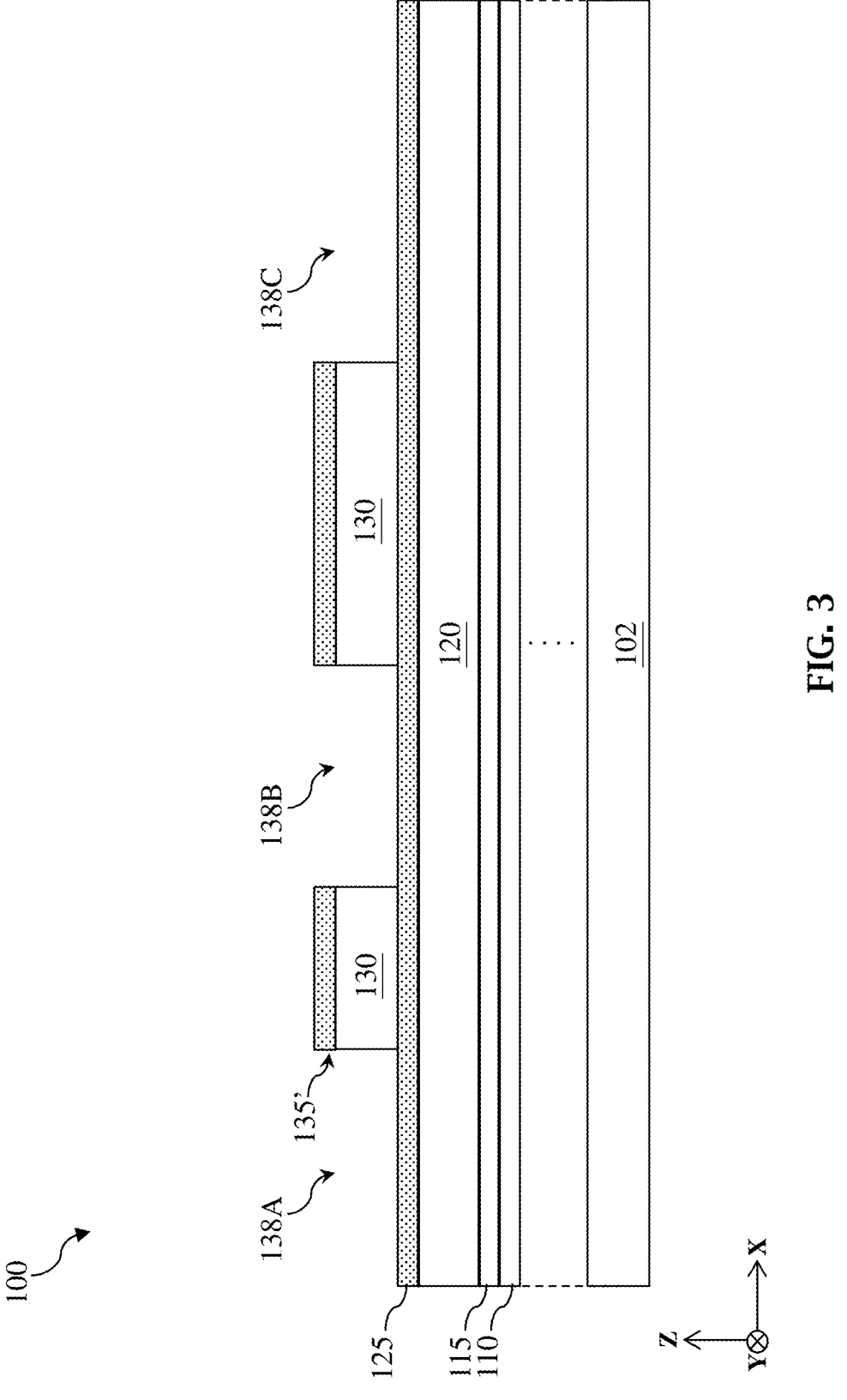

Turning to FIG. 3, dielectric layer 130 is patterned to form trenches therein, such as a trench 138A, a trench 138B, and a trench 138C. In some embodiments, trenches 138A-138C expose dielectric layer 125. In some embodiments, dielectric layer 130 can be patterned using a suitable combination of photolithography processes (e.g., photoresist deposition, exposure, and development) to form a first etch mask, a first etching process(es) using the first etch mask to pattern hard mask layer 135, thereby forming a second etch mask (e.g., patterned hard mask layer 135'), and a second etching process(es) using the second etch mask to pattern dielectric layer 130 (i.e., form trenches 138A-138C in dielectric layer 130). The first etching process and/or the second etching process can be a dry etch, a wet etch, or combinations thereof.

Figure 4:
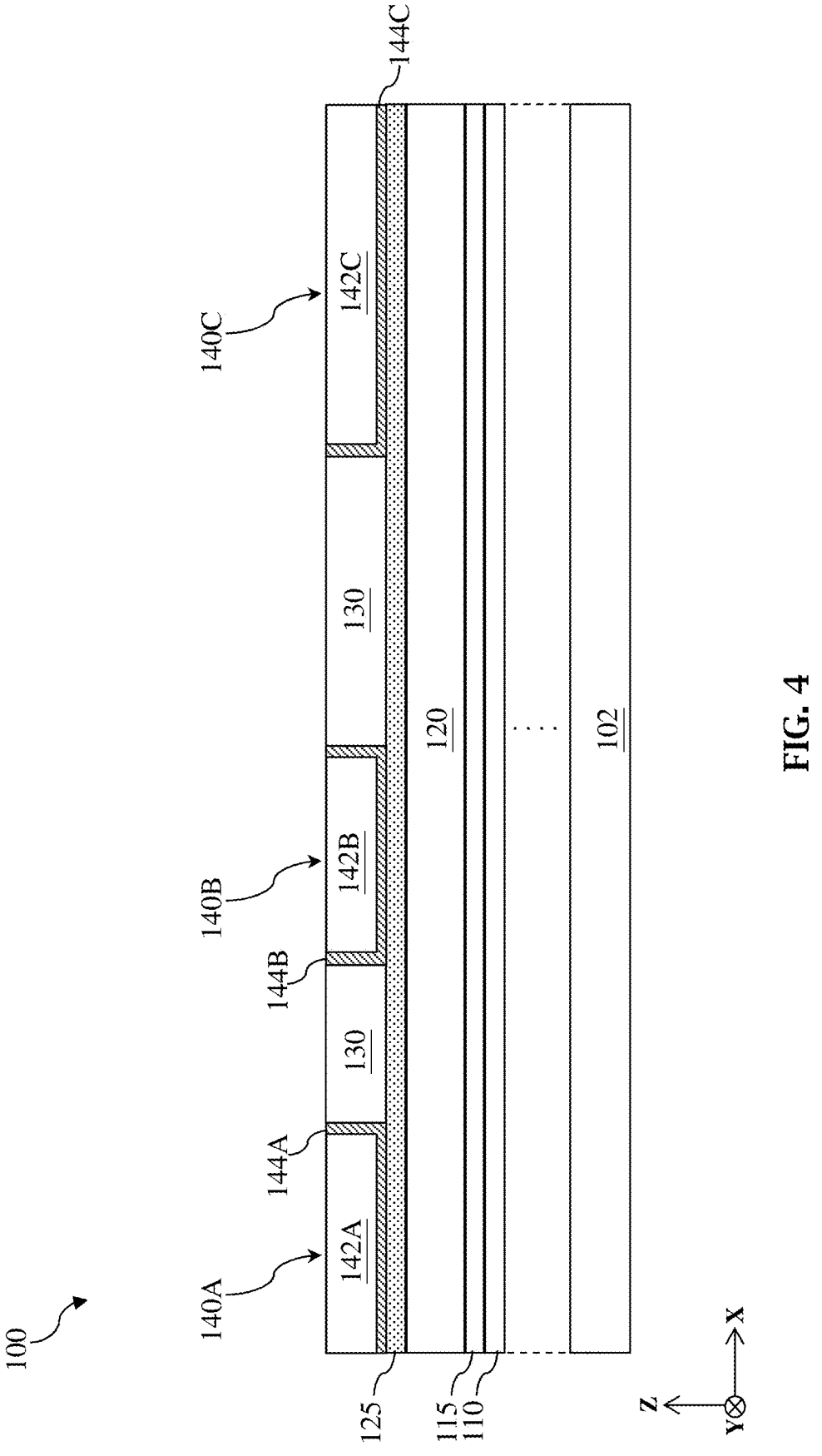

Turing to FIG. 4, a lower contact 140A, a lower contact 140B, and a lower contact 140C are formed in trench 138A, trench 138B, and trench 138C, respectively, of dielectric layer 130. Although lower contacts 140A-140C are disposed below upper contacts (discussed below), lower contacts 140A-140C are sometimes referred to as top metal (TM) contacts because they represent a top metal layer of an MLI structure. Lower contact 140A includes a plug 142A, lower contact 140B includes a plug 142B, and lower contact 140C includes a plug 142C. In some embodiments, lower contact 140A includes a liner 144A, lower contact 140B includes a liner 144B, and lower contact 140C includes a liner 144C. Plugs 142A-142C can also be referred to as fill layers, bulk layers, etc. Liners 144A-144C can also be referred to as barrier layers. Plugs 142A-142C and liners 144A-144C include electrically conductive material, such as aluminum, copper, titanium, tantalum, tungsten, ruthenium, molybdenum, cobalt, iridium, palladium, platinum, nickel, tin, gold, silver, other suitable metals, alloys thereof (e.g., TiN, TaN, TaC, TaCN, TiAl, TiAlN, etc.), silicides thereof (e.g., NiSi, CoSi, CuSi, TaSiN, etc.), or combinations thereof. In some embodiments, plugs 142A-142C are copper plugs. In some embodiments, liners 144A-144C include TiN, Ta, TaN, or combinations thereof.

In some embodiments, forming lower contacts 140A-140C includes forming a barrier layer over dielectric layer 130 that partially fills trenches 138A-138C, forming a metal fill layer over the barrier layer that fills remainders of trenches 138A-138C, and performing a planarization process that removes the barrier layer and the metal fill layer from a top surface of dielectric layer 130, such that remainders of the barrier layer and the metal fill layer form liners 144A-144C and plugs 142A-142C, respectively. The planarization process can be a chemical mechanical planarization (CMP) process. The barrier layer and/or the metal fill layer can be deposited by ALD, CVD, PVD, other deposition process (e.g., plating), or combinations thereof. The barrier layer and/or the metal fill layer may include multiple layers. In some embodiments, the barrier layer has a thickness of about 0.5 nm to about 20 nm. In some embodiments, the metal fill layer has a thickness of about 80 nm to about 2,000 nm. In some embodiments, lower contacts 140A-140C have a thickness of about 750 nm to about 950 nm.

Figure 5:
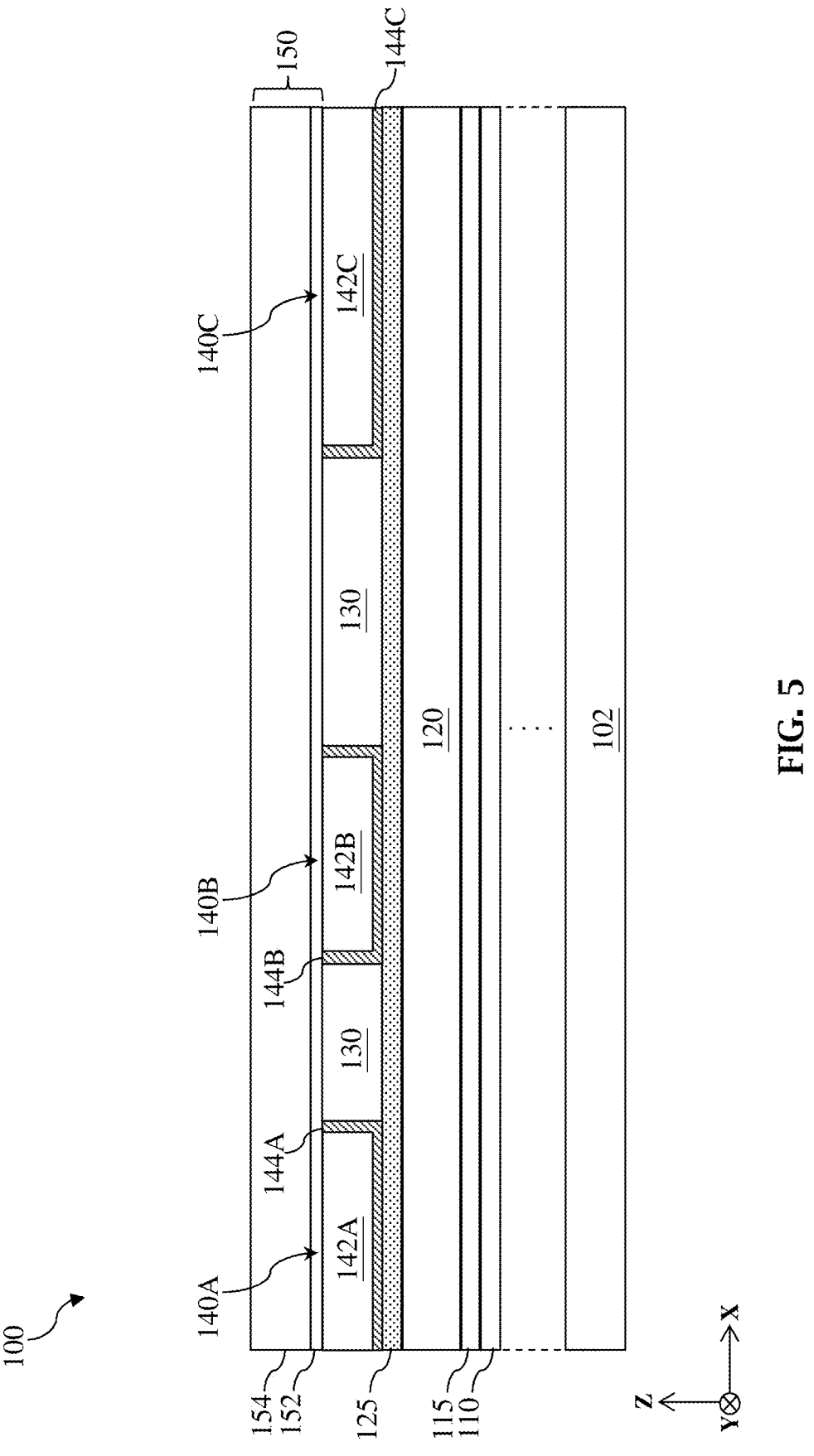

Turning to FIG. 5, a passivation layer 150 is formed over lower contacts 140A-140C. Passivation layer 150 may include multiple layers, such as a dielectric layer 152 and a dielectric layer 154. For example, dielectric layer 152 is formed over lower contacts 140A-140C and dielectric layer 154 is formed over dielectric layer 152. In some embodiments, dielectric layer 152 includes a nitrogen-containing material and/or a carbon-containing material, and dielectric layer 154 includes a silicon-and-oxygen containing material. For example, dielectric layer 152 is a silicon nitride layer, and dielectric layer 154 is a USG layer and/or a PEOX-USG layer. Dielectric layer 152 can be deposited by CVD, ALD, PVD, other deposition process, or combinations thereof. Dielectric layer 154 can be deposited by PECVD, HDP-CVD, SACVD, ALD, PVD, other deposition process, or combinations thereof. In some embodiments, dielectric layer

152 may prevent and/or inhibit oxidation of lower contacts 140A-140C. In some embodiments, dielectric layer 152 has a thickness of about 65 nm to about 85 nm. In some embodiments, dielectric layer 154 has a thickness of about 150 nm to about 350 nm.

Figure 12:
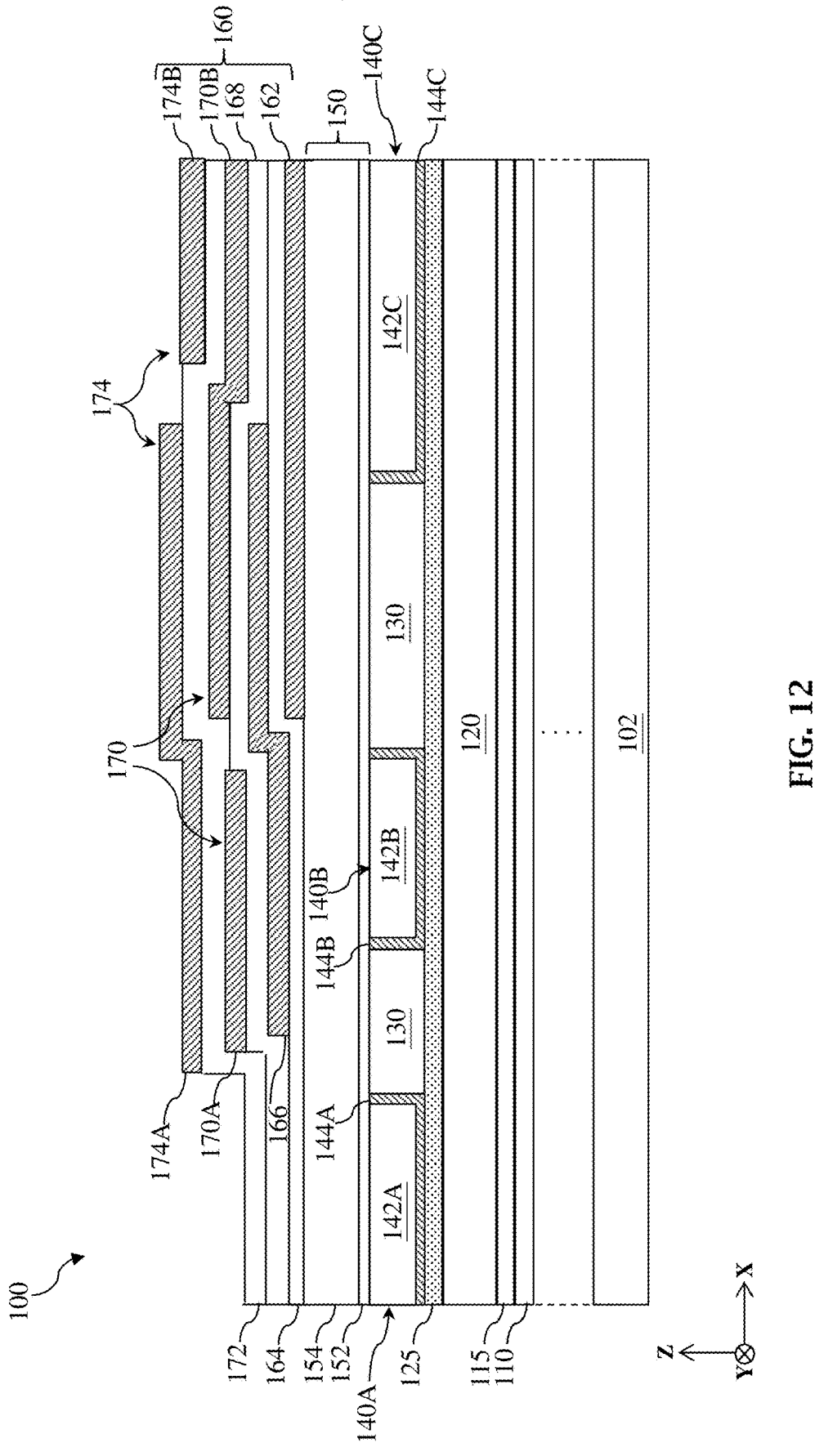

Turning to FIGS. 6-12, a metal-insulator-metal (MIM) capacitor structure, such as a MIM structure 160, is formed over device substrate 102. As discussed below, fabricating MIM structure 160 involves multiple processes, such as deposition and patterning of various conductor layers (e.g., a bottom conductor plate, a middle conductor plate, and a top conductor plate), as well as forming insulators between adjacent conductor plates. Thus, as shown in FIG. 12, in some embodiments, MIM structure 160 includes multiple metal layers, such as a conductor layer 162, a conductor layer 166, a conductor layer 170 (including, for example, a conductor layer 170A and a conductor layer 170B), and a conductor layer 174 (including, for example, a conductor layer 174A and a conductor layer 174B), which function as metal plates of capacitors. MIM structure 160 also includes multiple insulator layers, such as an insulator layer 164, an insulator layer 168, and an insulator layer 172. Insulator layer 164 is between conductor layer 162 and conductor layer 166 and between conductor layer 162 and conductor layer 170B. Insulator layer 168 is between conductor layer 166 and conductor layer 170A, between conductor layer 166 and conductor layer 170B, and between conductor layer 162 and conductor layer 170B. Insulator layer 172 is between conductor layer 170A and conductor layer 174A and between conductor layer 170B and conductor layer 174B.

MIM structure 160 thus has four conductor layers (electrodes), which can be referred to as a first conductor layer (MIM1) (i.e., conductor layer 162), a second conductor layer (MIM2) (i.e., conductor layer 166), a third conductor layer (MIM3) (i.e., conductor layer 170), and a fourth conductor layer (MIM4) (i.e., conductor layer 174). By way of example, the MIM structure 160 may be used to implement one or more capacitors, which may be connected to other microelectronic components (e.g., including active devices and/or passive devices, described above). For example, a capacitor can be provided by conductor layer 162, conductor layer 166, and conductor layer 170B, where conductor layer 162 is a CBM, conductor layer 166 is a CMM, and conductor layer 170B is a CTM of the capacitor. In another example, a capacitor can be provided by conductor layer 166, conductor layer 170B, and conductor layer 174A, where conductor layer 166 is a CBM, conductor layer 170B is a CMM, and conductor layer 174A is a CTM of the capacitor. In addition, and in some embodiments, MIM structure 160 allows capacitors to be closely packed together in both vertical directions and lateral directions, thereby reducing an amount of lateral space needed for implementing capacitors. As a result, MIM structure 160 may accommodate super high-density capacitors.

Figure 6:
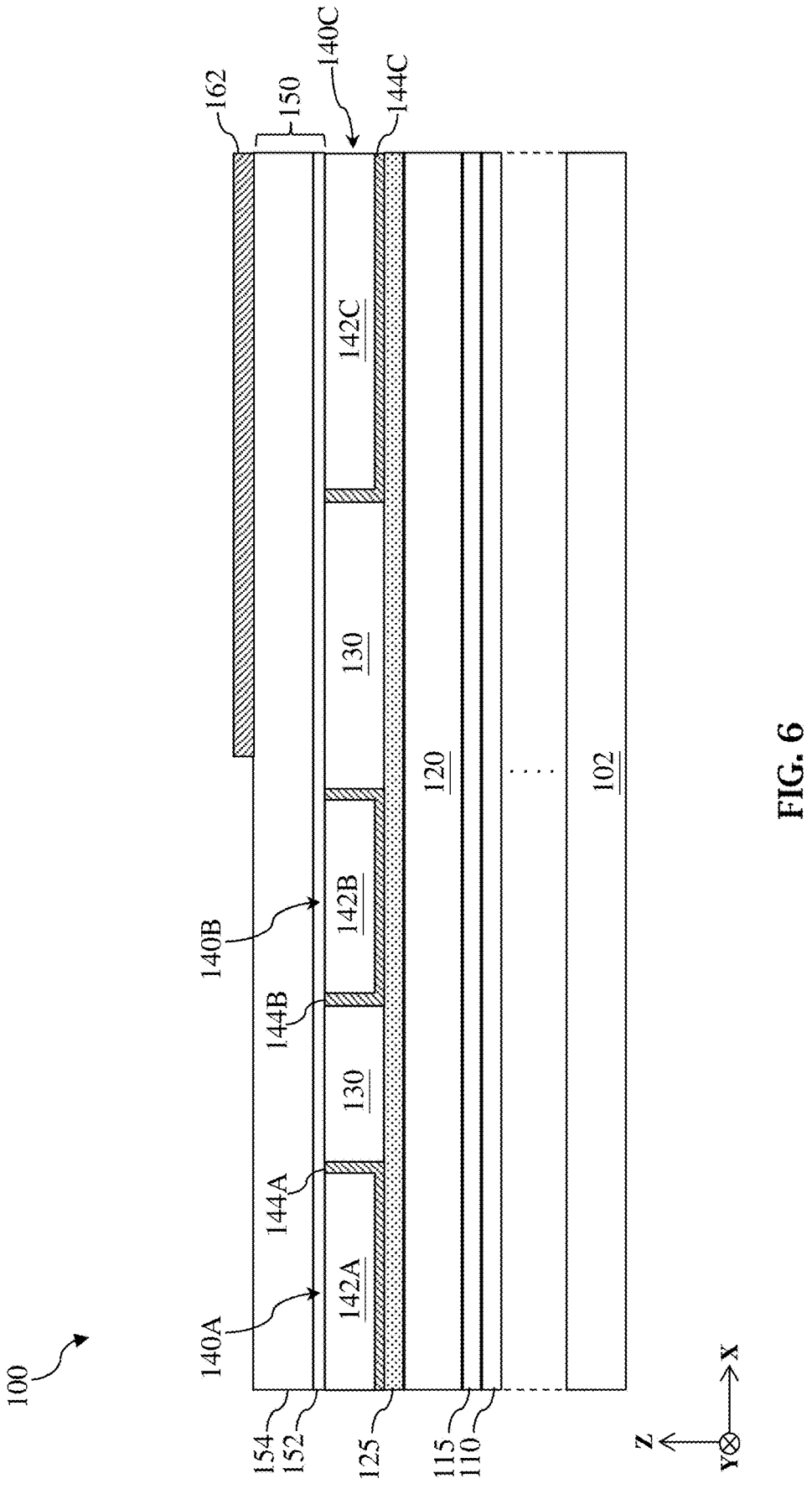
Figure 7:
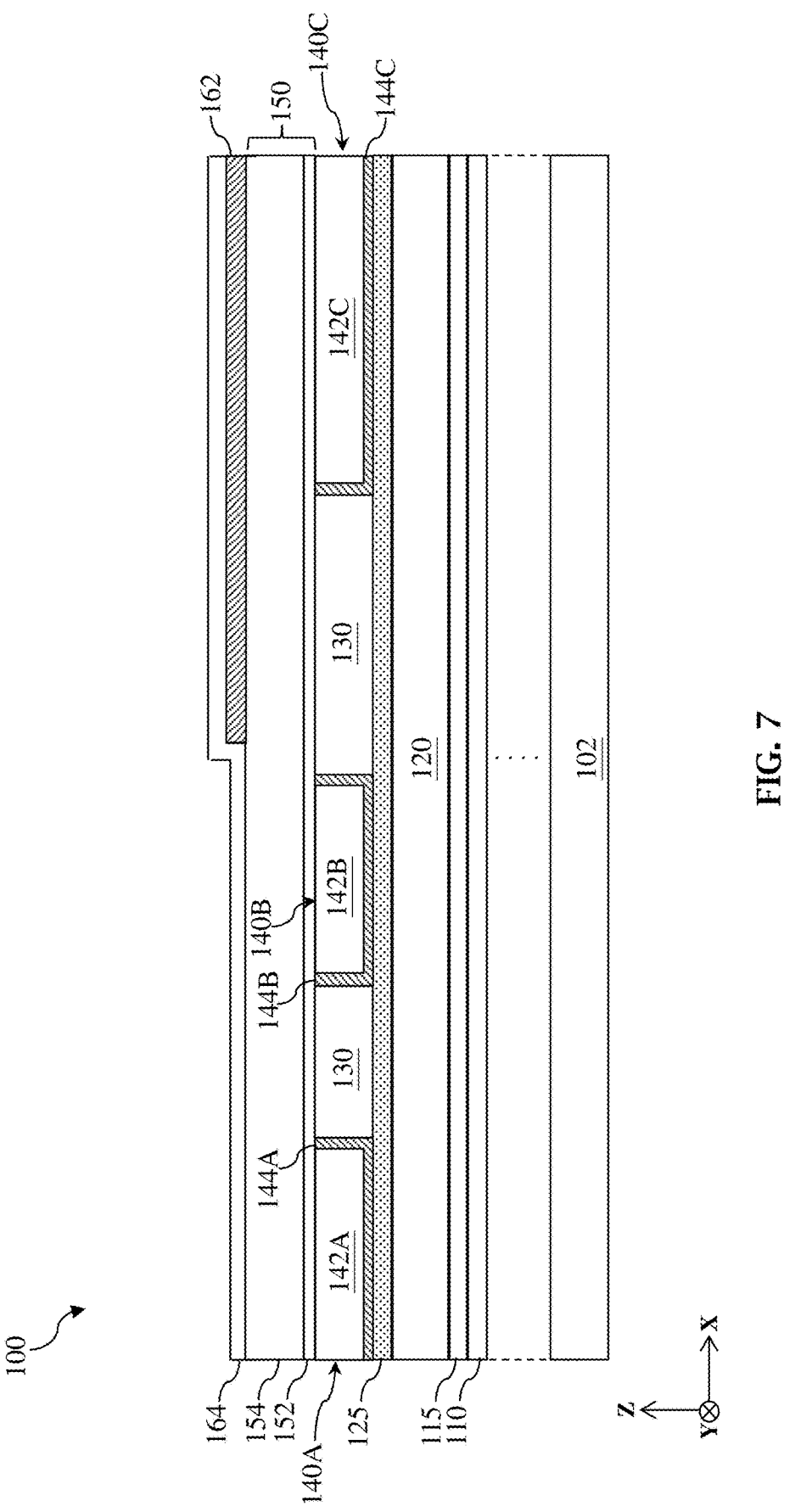
Figure 8:
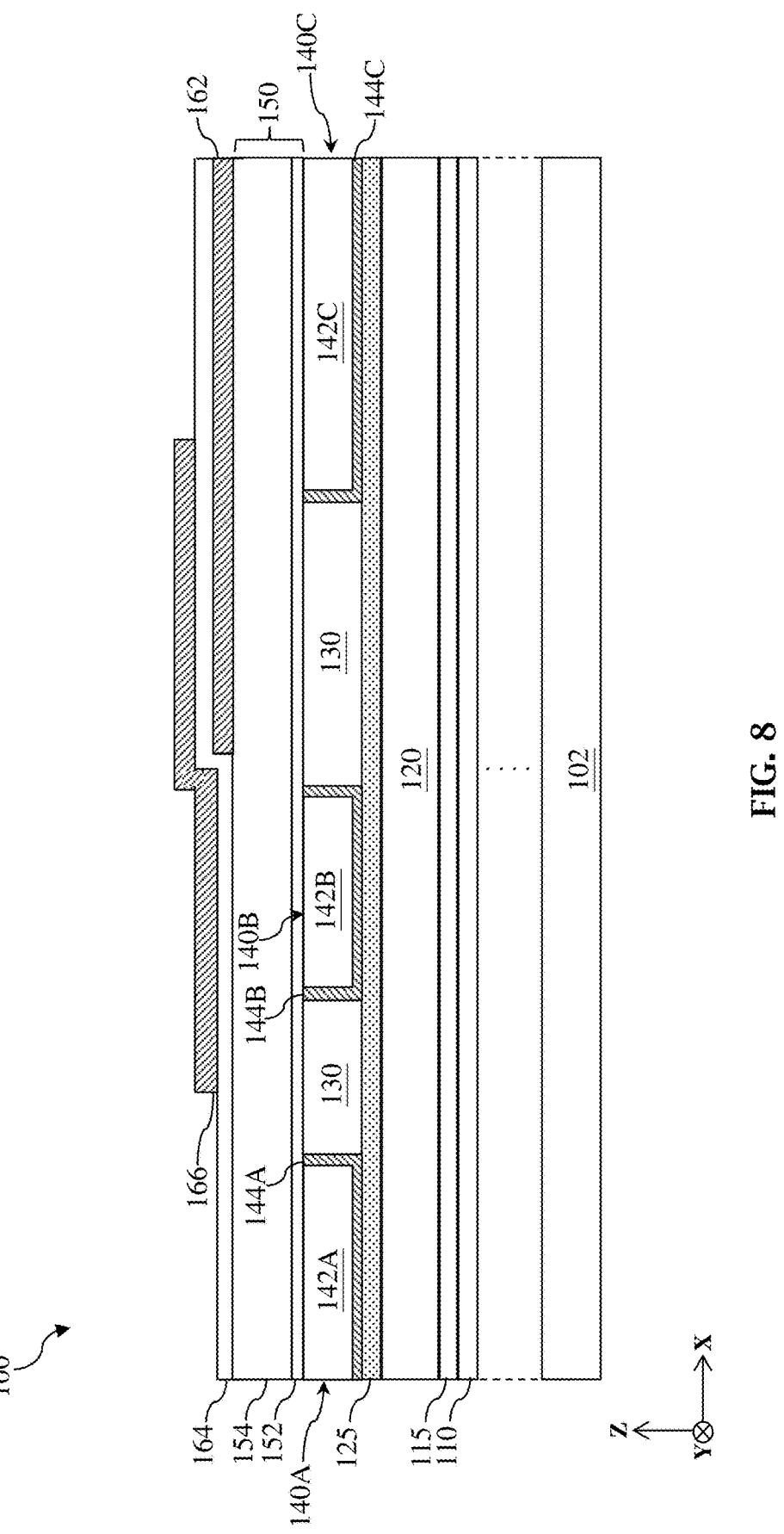
Figure 9:
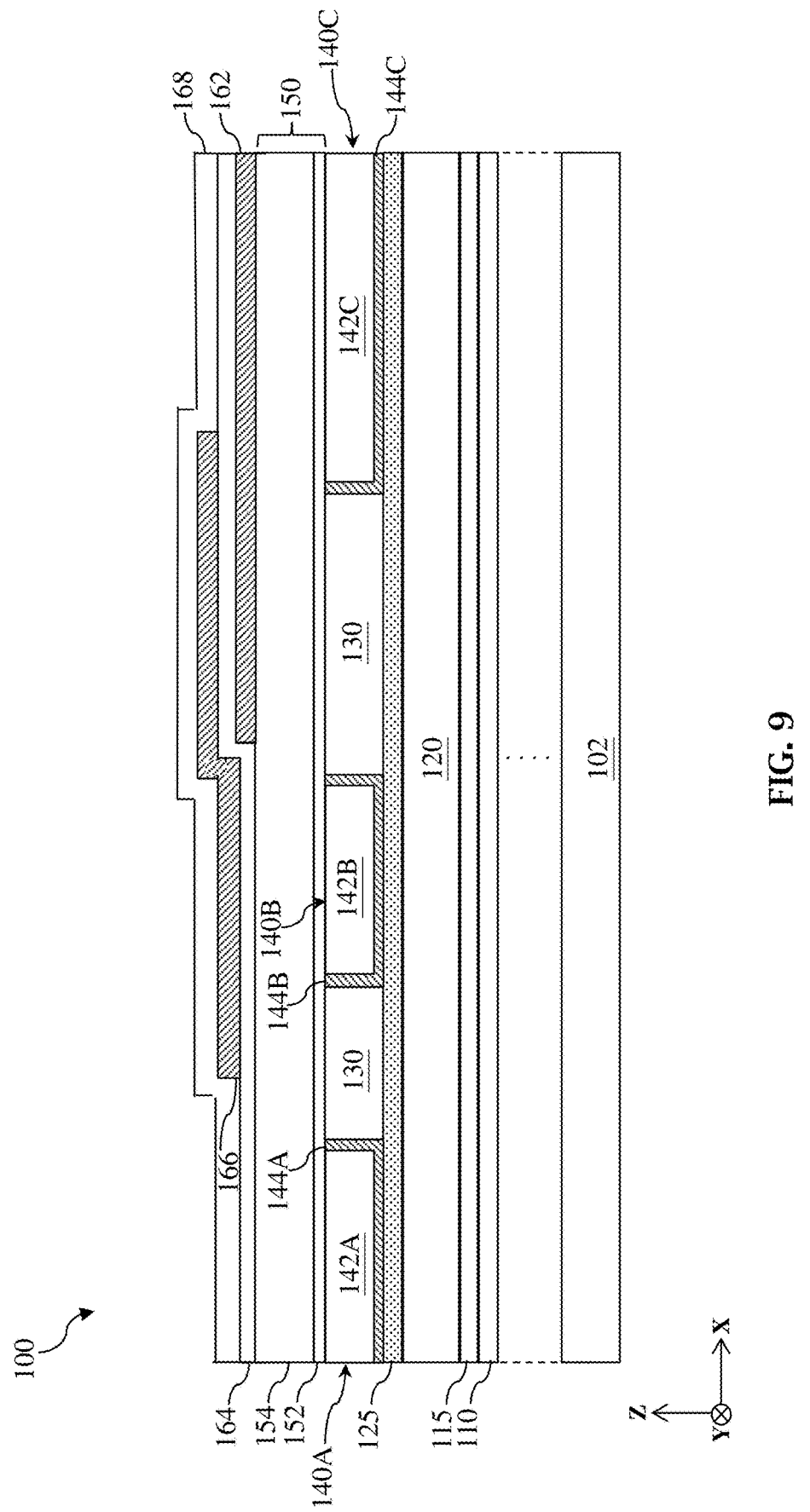
Figure 10:
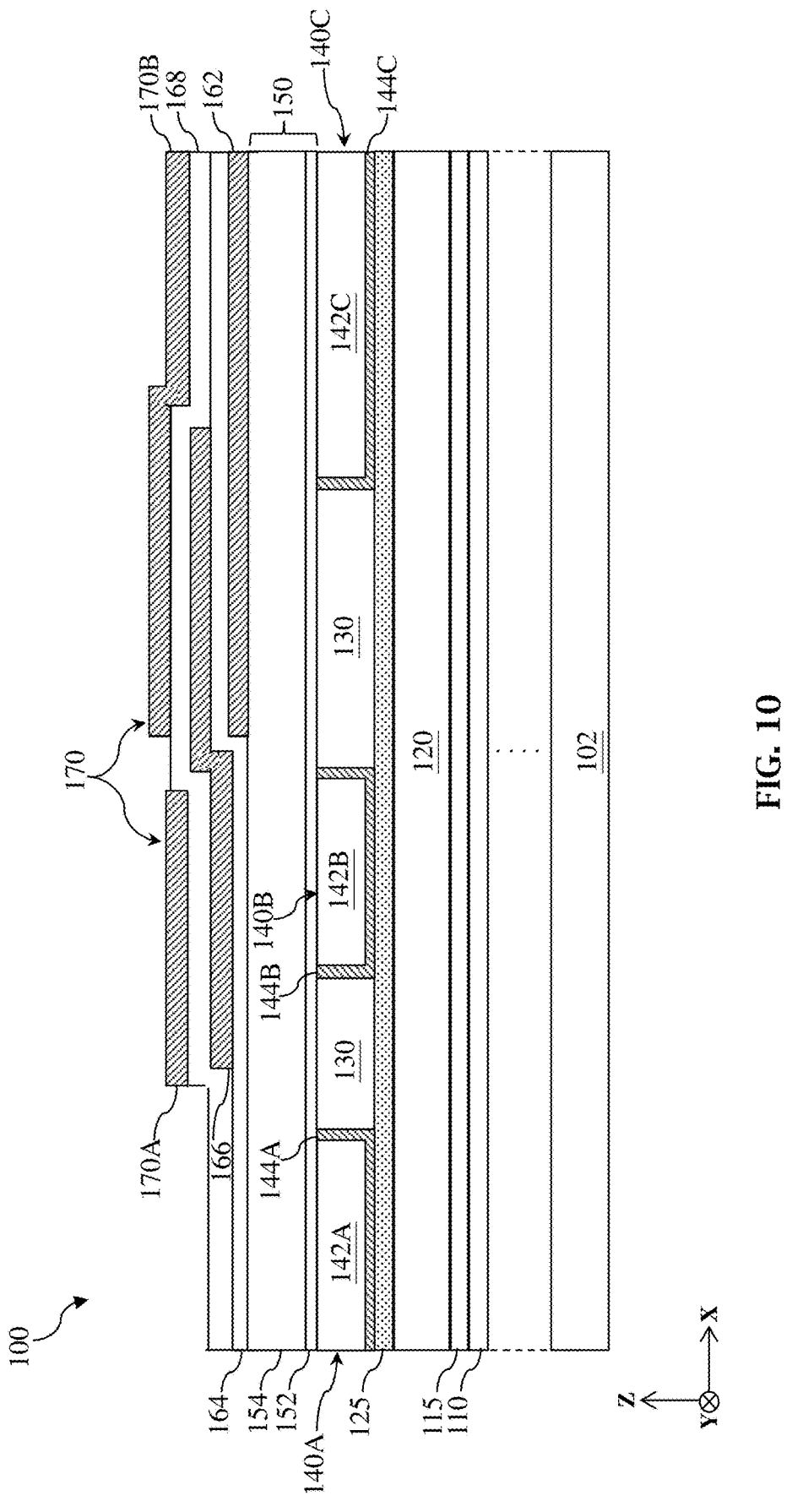
Figure 11:
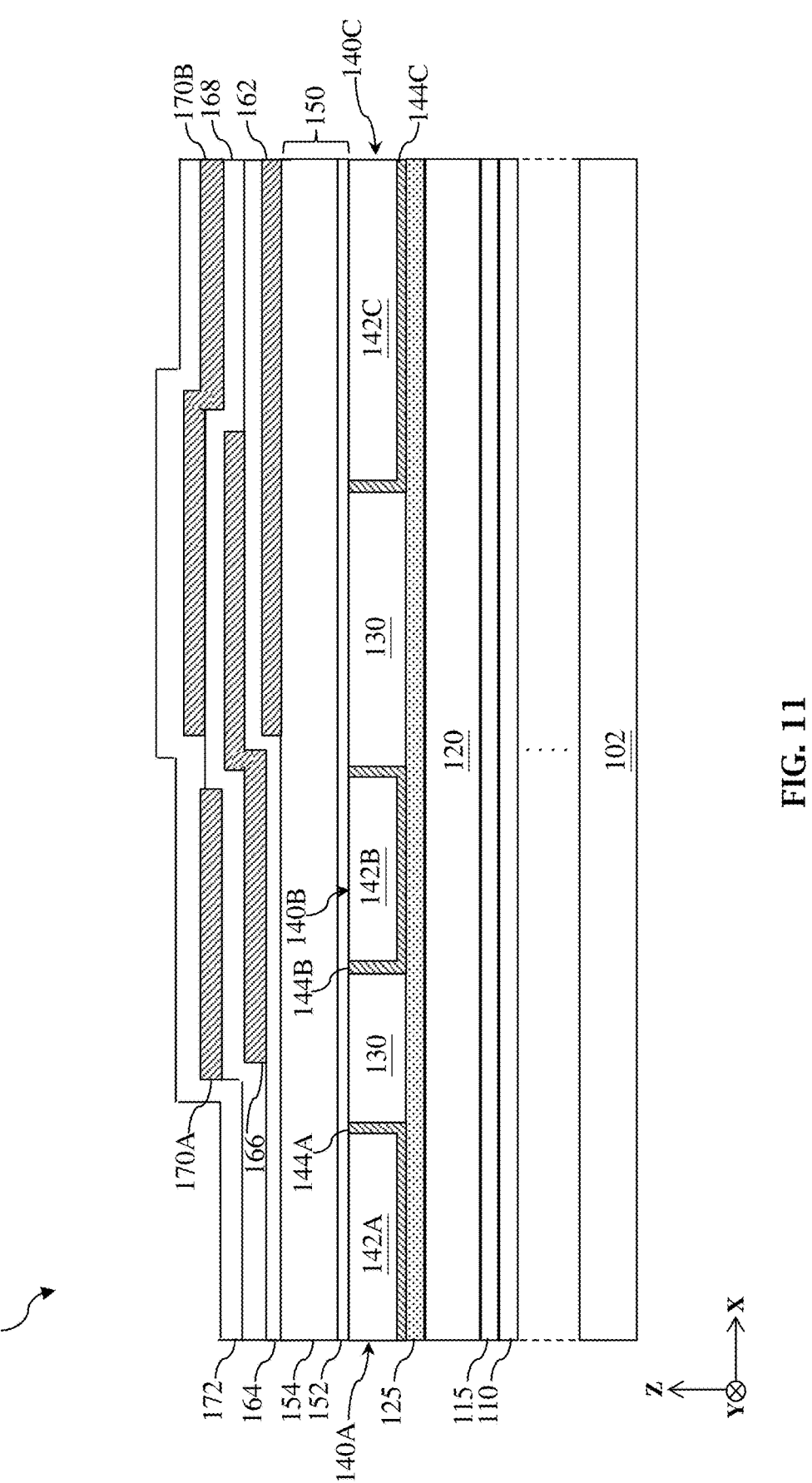

Turning to FIG. 6, patterned conductor layer 162 is formed over dielectric layer 154, for example, by depositing and patterning an electrically conductive material over dielectric layer 154. The patterning can include a photolithography process (e.g., forming a patterned etch mask over the electrically conductive material) and an etching process (e.g., etching the electrically conductive material using the patterned etch mask). In some embodiments, conductor layer 162 is a metal nitride layer, such as a TiN layer. Conductor layer 162 may undergo a surface treatment, such as sidewall passivation using a nitrous oxide ($N_2O$) gas. In some embodiments, conductor layer 162 has a thickness of about 35 nm to about 45 nm.

Turning to FIGS. 7-12, insulator layer 164 is formed over conductor layer 162 (FIG. 7), patterned conductor layer 166 is formed over insulator layer 164 (FIG. 8), insulator layer 168 is formed over conductor layer 166 (FIG. 9), patterned conductor layer 170 is formed over insulator layer 168 (FIG. 10), insulator layer 172 is formed over conductor layer 170 (FIG. 11), and patterned conductor layer 174 is formed over insulator layer 172 (FIG. 12). Conductor layer 166, conductor layer 170, and conductor layer 174 can be formed in a manner similar to that used to form conductor layer 162, but patterns of conductor layer 166, conductor layer 170, and conductor layer 174 can be different from a pattern of conductor layer 166 and/or different from one another, such as depicted. In some embodiments, conductor layer 166, conductor layer 170, and conductor layer 174 are metal nitride layers, such as TiN layers. In some embodiments, conductor layer 166, conductor layer 170, and conductor layer 174 have a thickness of about 35 nm to about 45 nm. In the depicted embodiment, conductor layer 162, conductor layer 166, conductor layer 170, and conductor layer 174 have different patterns but are formed from the same materials and have the same thicknesses. In some embodiments, conductor layer 162, conductor layer 166, conductor layer 170, conductor layer 174, or combinations thereof are formed from different materials and/or have different thicknesses. In some embodiments, conductor layer 162, conductor layer 166, conductor layer 170, conductor layer 174, or combinations thereof include any suitable electrically conductive material.

Insulator layer 164, insulator layer 168, insulator layer 172, or combinations thereof can be deposited by ALD, CVD, PVD, other deposition process, or combinations thereof. In some embodiments, insulator layer 164 is conformally deposited and has a generally uniform thickness (e.g., insulator layer 164 has about the same thickness on top and sidewall surfaces of conductor layer 162). In some embodiments, insulator layer 168 is conformally deposited and has a generally uniform thickness (e.g., insulator layer 168 has about the same thickness on top and sidewall surfaces of conductor layer 166). In some embodiments, insulator layer 172 is conformally deposited and has a generally uniform thickness (e.g., insulator layer 172 has about the same thickness on top and sidewall surfaces of conductor layer 170).

In some embodiments, insulator layer 164, insulator layer 168, insulator layer 172, or combinations thereof include high-k dielectric material(s) having a dielectric constant (k-value) greater than that of silicon oxide. In some embodiments, insulator layer 164, insulator layer 168, insulator layer 172, or combinations thereof has a tri-layer structure including, from bottom to top, a first zirconium oxide (e.g., $ZrO_2$) layer, an aluminum oxide ($Al_2O_3$) layer, and a second zirconium oxide ($ZrO_2$) layer. In such embodiments, insulator layer 164, insulator layer 168, insulator layer 172, or combinations thereof may be referred to as a ZAZ layer. In such embodiments, each of layer of the ZAZ layer may have a thickness of about 1.5 nm to about 2.5 nm. In some embodiments, insulator layer 164, insulator layer 168, insulator layer 172, or combinations thereof may be relatively thin to increase capacitance values, while maintaining sufficient thickness to avoid potential dielectric breakdown of capacitors in MIM structure 160 (e.g., when two capacitor plates have high potential difference, current may leak between the plates, causing breakdown). In some embodiments, insulator layer 164, insulator layer 168, insulator layer 172, or combinations thereof has a thickness of about 5 nm to about 7 nm.

Figure 13:
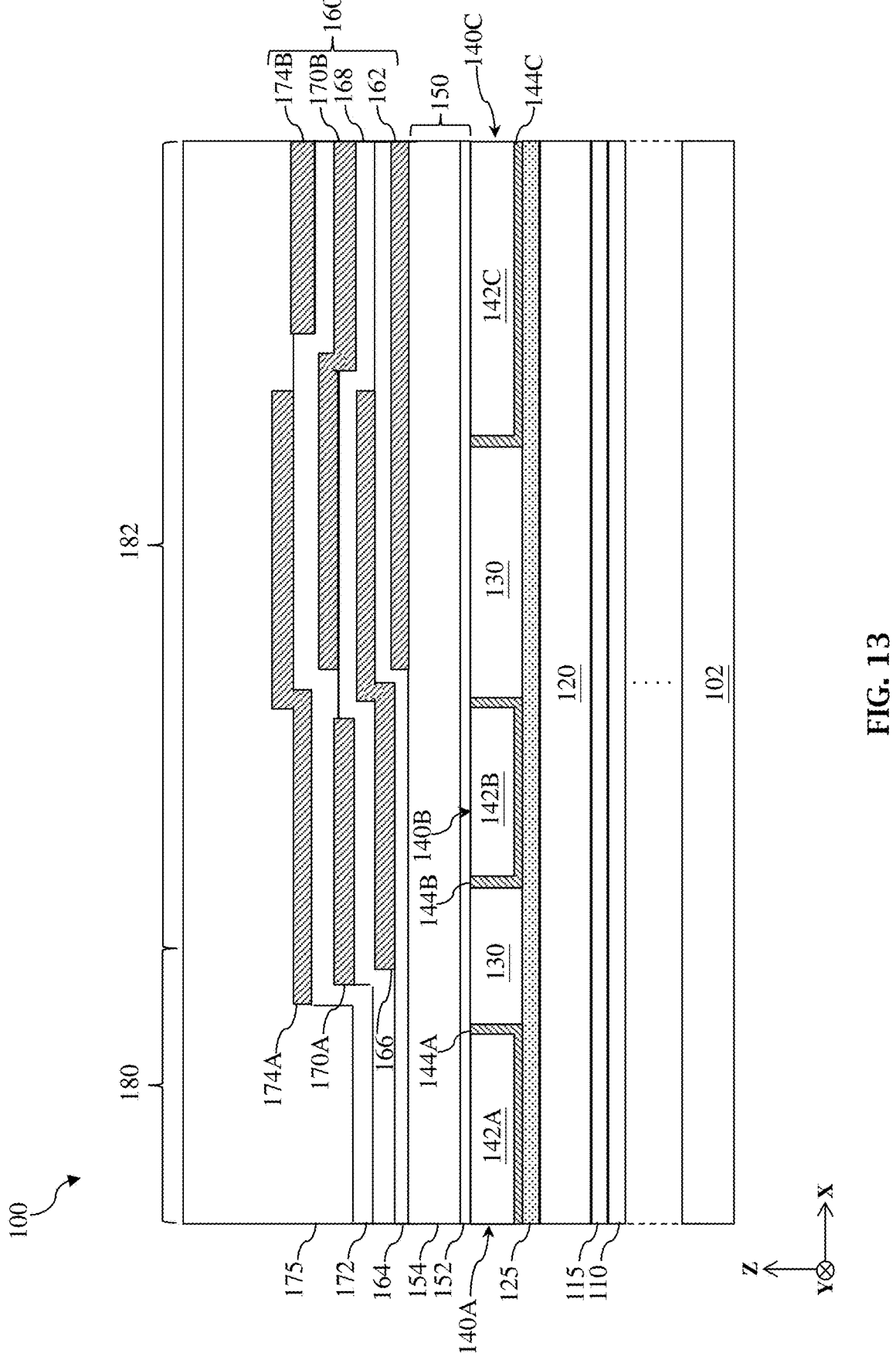

Turning to FIG. 13, a passivation layer 175 is formed over MIM structure 160. In some embodiments, passivation layer 175 includes a silicon-and-oxygen containing material. For example, passivation layer 175 is a USG layer and/or a PEOX-USG layer. Passivation layer 175 can be deposited by PECVD, HDP-CVD, SACVD, ALD, PVD, other deposition process, or combinations thereof. In some embodiments, a planarization process (e.g., CMP) and/or an etching process is performed on passivation layer 175, for example, to reduce its thickness. In some embodiments, passivation layer 175 has a thickness of about 450 nm to about 650 nm. In some embodiments, passivation layer 175 includes multiple layers.

Figure 14:
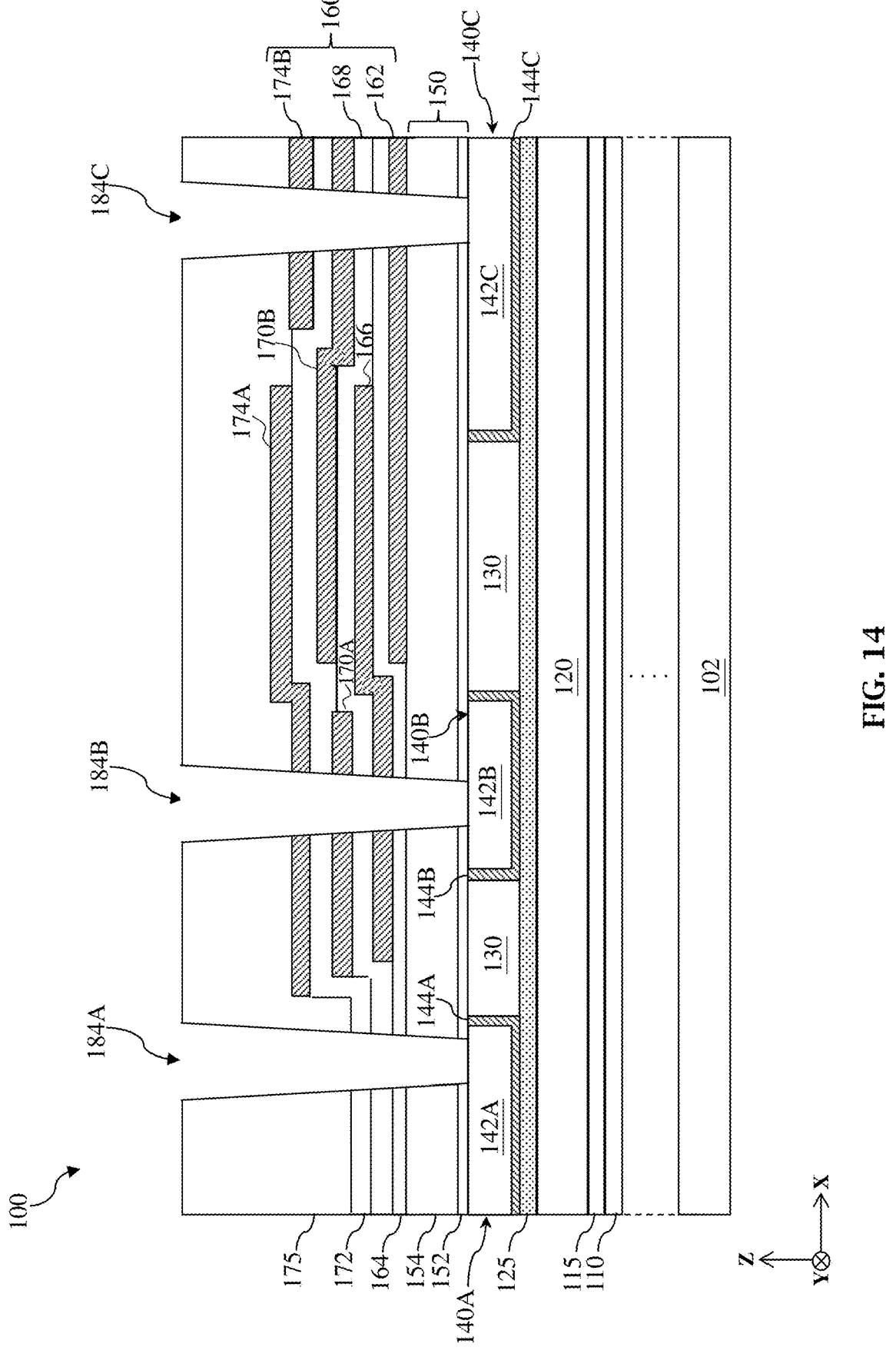

Turning to FIG. 14, contact openings are formed to expose lower contacts 140A-140C, such as a contact opening 184A, a contact opening 184B, and a contact opening 184C, respectively. Contact opening 184A extends through, from top to bottom, passivation layer 175, insulator layer 172, insulator layer 168, insulator layer 164, and passivation layer 150 (e.g., dielectric layer 154 and dielectric layer 152) to expose a top surface of lower contact 140A. Contact opening 184B extends through, from top to bottom, passivation layer 175, a portion of MIM structure 160 (including, for example, conductor layer 174A, insulator layer 172, conductor layer 170A, insulator layer 168, conductor layer 166, and insulator layer 164), and passivation layer 150 to expose a top surface of lower contact 140B. Contact opening 184C extends through, from top to bottom, passivation layer 175, a portion of MIM structure 160 (including, for example, conductor layer 174B, insulator layer 172, conductor layer 170B, insulator layer 168, insulator layer 164, and conductor layer 162), and passivation layer 150 to expose a top surface of lower contact 140C. Contact openings 184A-184C may expose sidewalls of the various layers through which contact openings 184A-184C respectively extend.

In some embodiments, forming contact openings 184A-184C includes forming a patterned etch mask over passivation layer 175 (e.g., by a photolithography process) and etching passivation layer 175, conductor layer 174A, conductor layer 174B, insulator layer 172, conductor layer 170A, conductor layer 170B, insulator layer 168, conductor layer 166, insulator layer 164, conductor layer 162, and passivation layer 150. The etching is a dry etch, a wet etch, other suitable etch, or combinations thereof. The etching may be a multistep process. For example, the etching may alternate etchants when etching conductor layers and insulator layers. In some embodiments, patterns of conductor layers are configured to ensure that contact openings 184A-184C pass through a same number of conductor layers, which can improve uniformity during the etching. For example, in FIG. 14, contact opening 184B and contact opening 184C extend through three conductor layers. Contact opening 184B passes through conductor layer 174A, conductor layer 170A, and conductor layer 166 (i.e., through MIM 4, MIM3, and MIM2). Contact opening 184C passes through conductor layer 174B, conductor layer 170B, and conductor layer 162 (i.e., through MIM 4, MIM3, and MIM1).

Figure 15:
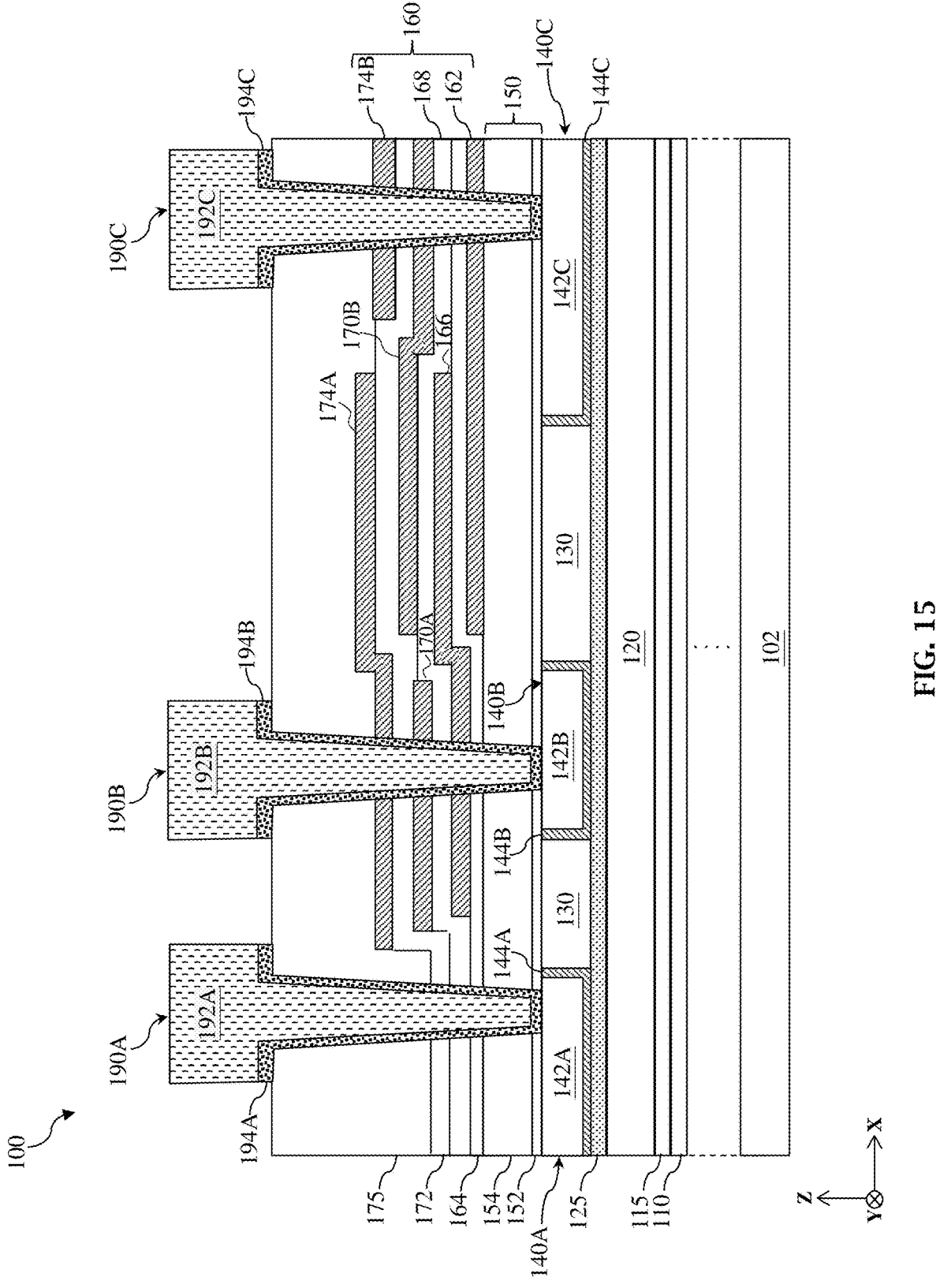

Turning to FIG. 15, upper contacts are formed in and over contact openings 184A-184C, such as an upper contact 190A, an upper contact 190B, and an upper contact 190C, respectively. Upper contacts 190A-190C may be referred to as contact vias, metal vias, metal lines, or combinations thereof. In some embodiments, upper contacts 190A-190C may be referred to as contact pads. Upper contact 190A includes a plug 192A, lower contact 190B includes a plug 192B, and lower contact 190C includes a plug 192C. In some embodiments, upper contact 190A includes a liner 194A, upper contact 190B includes a liner 194B, and upper contact 190C includes a liner 194C. Plugs 192A-192C can also be referred to as fill layers, bulk layers, etc. Liners 194A-194C can also be referred to as barrier layers and/or seed layers. Plugs 192A-192C and liners 194A-194C include electrically conductive material, such as aluminum, copper, titanium, tantalum, tungsten, ruthenium, molybdenum, cobalt, iridium, palladium, platinum, nickel, tin, gold, silver, other suitable metals, alloys thereof (e.g., TiN, TaN, TaC, TaCN, TiAl, TiAlN, etc.), silicides thereof (e.g., NiSi, CoSi, CuSi, TaSiN, etc.), or combinations thereof. In some embodiments, plugs 192A-192C are AlCu plugs. In some embodiments, liners 194A-194C are seed layers that include materials configured for AlCu plugs.

In some embodiments, forming upper contacts 190A-190C includes forming a barrier layer over passivation layer 175 that partially fills contact openings 184A-184C, forming a metal fill layer over the barrier layer that fills remainders of contact openings 184A-184C, and patterning the metal fill layer and the barrier layer to form liners 194A-194C and plugs 192A-192C, respectively. The patterning can include forming a patterned mask layer (e.g., forming a patterned SiON layer over the metal fill layer using a photolithography process and an etching process) and etching the metal fill layer and the barrier layer using the patterned mask layer as an etch mask. The metal fill layer and the barrier layer are patterned to provide plugs 192A-192C and liners 194A-194C with upper portions that extend from contact openings 184A-184C and over a top surface of passivation layer 175. The barrier layer and/or the metal fill layer can be deposited by ALD, CVD, PVD, other deposition process (e.g., plating), or combinations thereof. The barrier layer and/or the metal fill layer may include multiple layers. In some embodiments, a thickness of plugs 192A-192C is about 1,000 nm to about 3,000 nm.

Upper contacts 190A-190C provide electrical contact to lower contacts 140A-140C, respectively. In addition, and as shown in the depicted embodiment, upper contact 190B is electrically coupled to conductor layer 174A, conductor layer 170A, and conductor layer 166, while being electrically isolated from conductor layer 174B, conductor layer 170B, and conductor layer 162. Further, upper contact 190C is electrically coupled to conductor layer 174B, conductor layer 170B, and conductor layer 162, while being electrically isolated from conductor layer 174A, conductor layer 170A, and conductor layer 166. Thus, upper contact 190B provides electrical contact to a first terminal of MIM structure 160, and upper contact 190C provides electrical contact to a second terminal of MIM structure 160. In some embodiments, upper contacts 190A-190C are part of a redistribution layer (RDL) that includes various metal lines for redistributing bonding pads to different locations, such as from peripheral locations to locations uniformly distributed on a chip surface. Upper contacts 190A-190C may thus be referred to as redistribution vias. In some embodiments, the RDL may couple the multi-layer interconnect (MLI) structure to the bonding pads for connection to external circuitry.

Figure 16:
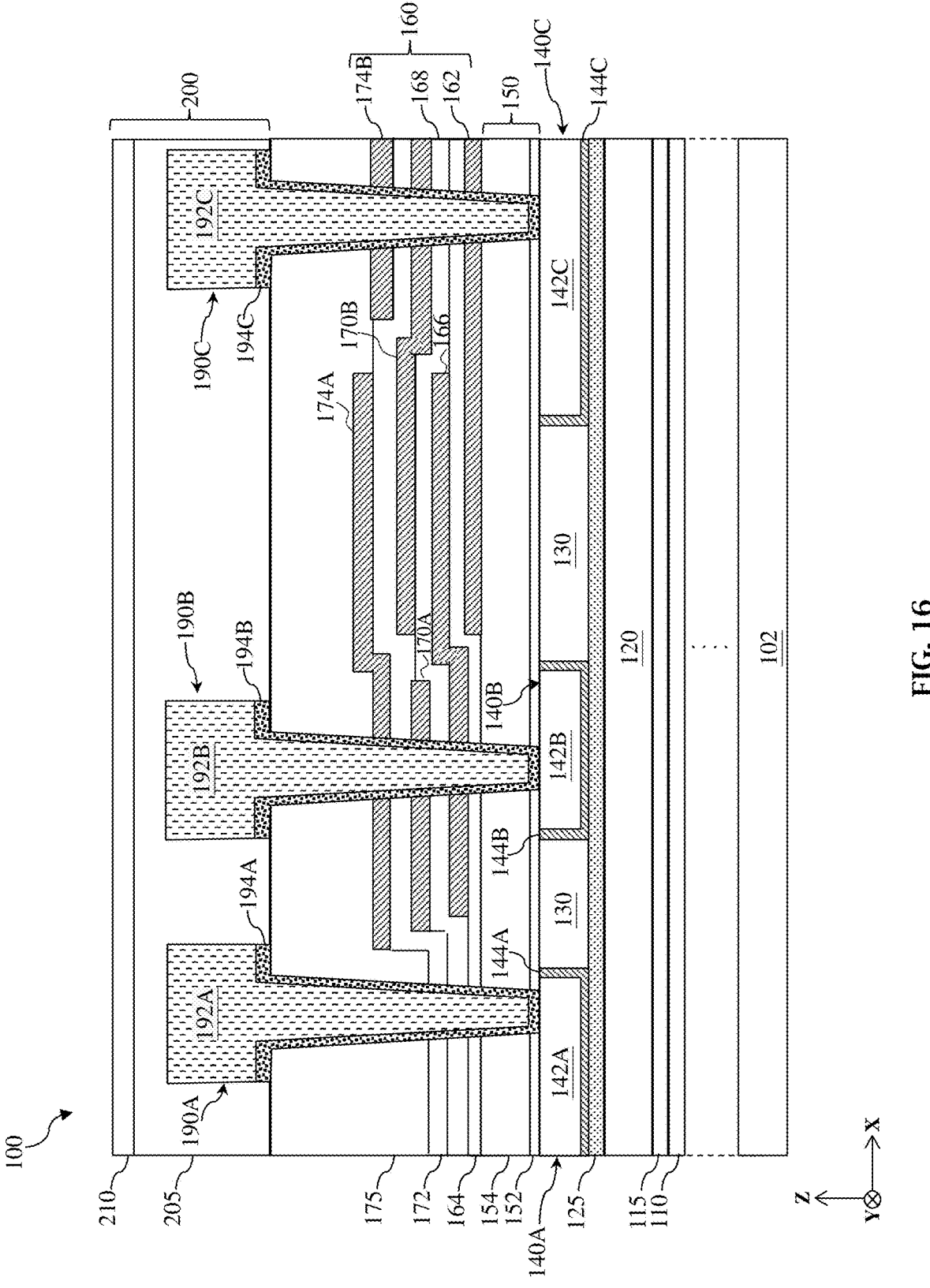

Turning to FIG. 16, a passivation layer 200 is formed over upper contacts 190A-190C and passivation layer 175. Passivation layer 200 may include multiple layers, such as a dielectric layer 205 and a dielectric layer 210. For example, dielectric layer 205 is formed over upper portions of upper contacts 190A-190C and passivation layer 175, and dielectric layer 210 is formed over dielectric layer 205. In some embodiments, dielectric layer 205 includes a silicon-and-oxygen containing material, and dielectric layer 210 includes a nitrogen-containing material and/or a carbon-containing material. For example, dielectric layer 205 is a USG layer and/or a PEOX-USG layer, and dielectric layer 210 is a silicon nitride layer and/or a plasma-enhanced (PE) silicon nitride layer. Dielectric layer 205 can be deposited by PECVD, HDP-CVD, SACVD, ALD, PVD, other deposition process, or combinations thereof. Dielectric layer 210 can be deposited by CVD, ALD, PVD, other deposition process, or combinations thereof.

Figure 17:
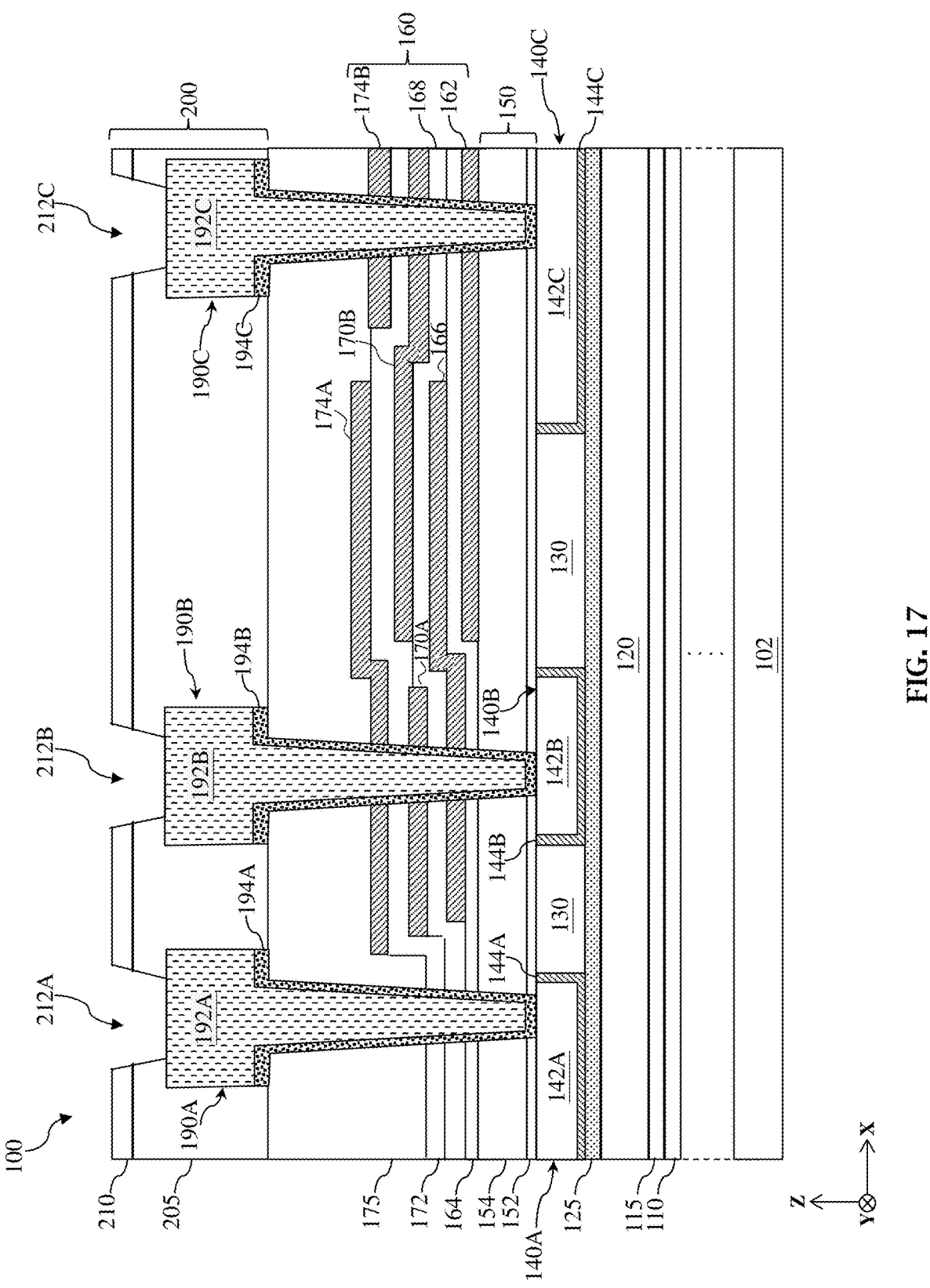

Turning to FIG. 17, openings (trenches) are formed in passivation layer 200 that expose upper contacts 190A-190C, such as an opening 212A, an opening 212B, and an opening 212C, respectively. Openings 212A-212C extend through, from top to bottom, dielectric layer 210 and dielectric layer 205 to expose top surfaces of upper contacts 190A-190C, respectively. In some embodiments, forming openings 212A-212C includes forming a patterned etch mask over passivation layer 200 (e.g., by a photolithography process) and etching dielectric layer 210 and/or dielectric layer 205 using the patterned etch mask. The etching may include a dry etch, a wet etch, other suitable etch, or combinations thereof. In some embodiments, dielectric layer 205 may be etched using patterned dielectric layer 210 as an etch mask. The etching may be a multistep process. In some embodiments, openings 212A-212C may expose sidewalls of the various layers through which openings 212A-212C extend.

Figure 18:
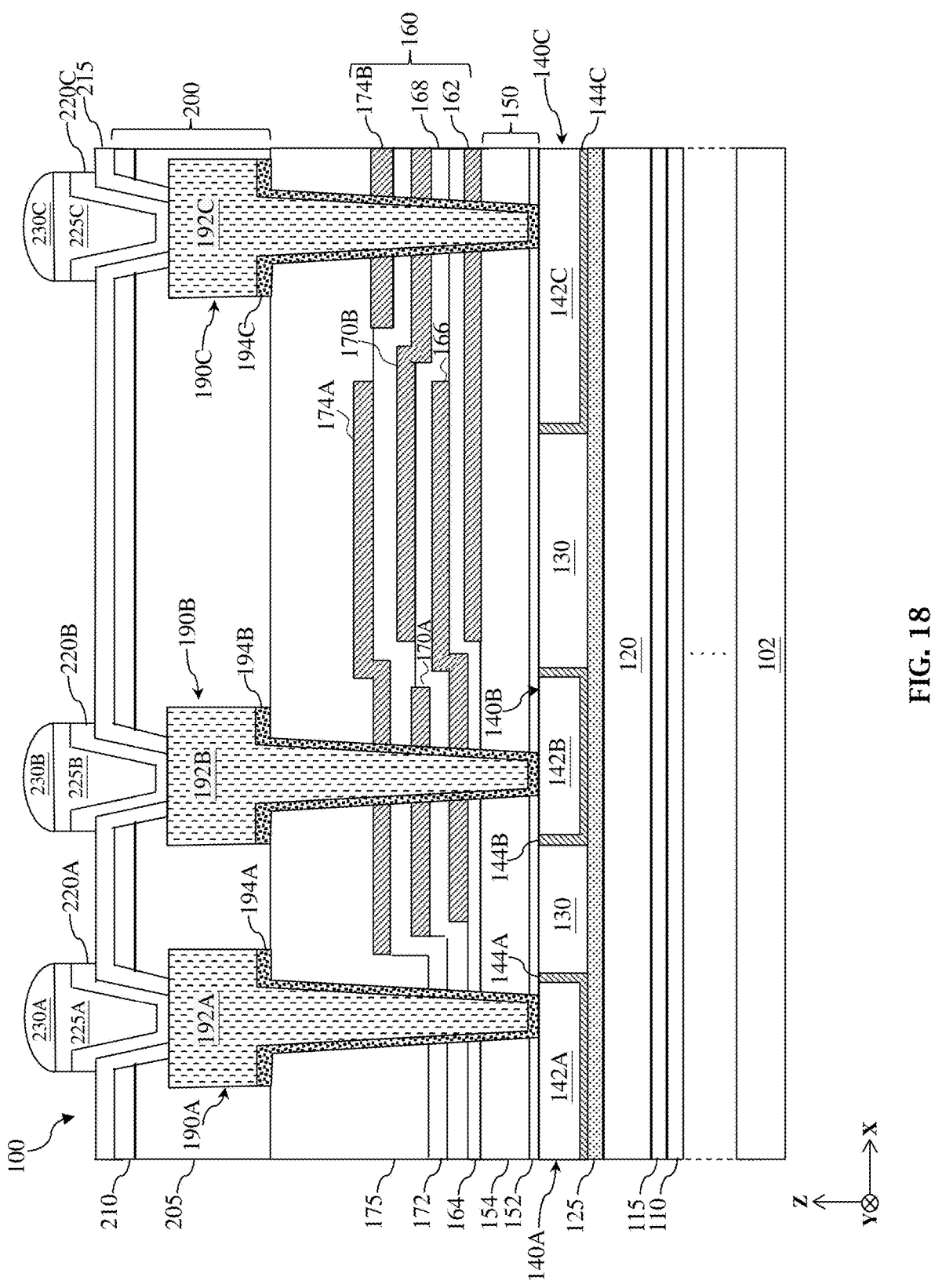

Turning to FIG. 18, in some embodiments, a patterned polyimide (PI) layer 215 is formed over passivation layer 200. In some embodiments, forming PI layer 215 includes depositing a polymide material over passivation layer 200 that partially fills openings 212A-212C and patterning the polymide material, for example, to expose top surfaces of upper contacts 190A-190C. In some embodiments, the polymide material is conformally deposited by spin-coating and/or other suitable deposition process. In some embodiments, a baking process is performed after deposition the polymide material. In some embodiments, the patterning includes forming a patterned mask layer over the polymide material (e.g., by a photolithography process) and etching the polymide material using the patterned mask layer as an etch mask. In some embodiments, PI layer 215 includes a photosensitive chemical, such that PI layer 215 can be directly patterned by a photolithography process, without a subsequent etch process.

In some embodiments, a bumping process is performed to form under-bump metallization (UBM), metal pillars (or metal bumps), and solder bumps. For example, a UBM 220A, a copper (Cu) pillar 225A, and a solder bump 230A are formed over PI layer 215 and upper contact 190A; a UBM 220B, a Cu pillar 225B, and a solder bump 230B are formed over PI layer 215 and upper contact 190B; and a UBM 220C, a Cu pillar 225C, and a solder bump 230C are formed over PI layer 215 and upper contact 190C. UBMs 220A-220C and Cu pillars 225A-225C fill openings 212A-212C, respectively, and extend over top surface of PI layer 215. Cu pillars 225A-225C are disposed over UBMs 220A-220C, respectively, and solder bumps 230A-230C are disposed over, respectively. In some embodiments, UBMs 220A-220C, Cu pillars 225A-225C, and solder bumps 230A-230C provide contact structures of device 100 that can facilitate connection to external circuitry.

In some embodiments, UBMs 220A-220C provide low resistance electrical connections to the RDL within upper portions of upper contacts 190A-190C. UBMs 220A-220C can also hermetically seal and prevent diffusion of other bump metals into device 100. In some embodiments, UBMs 220A-220C include multiple layers of different metals, such as an adhesion layer (e.g., Ti, Cr, Al, other metal, or combinations thereof), a diffusion barrier layer (e.g., CrCu alloy and/or other suitable metal(s)), a solderable layer, and an oxidation barrier layer (e.g., Au and/or other suitable metal(s)). Various layers of UBMs 220A-220C can be deposited by electroplating, sputtering, evaporation, other method, or combinations thereof. In some embodiments, Cu seed layers are formed between Cu pillars 225A-225C and UBMs 220A-220C, for example, by an electroplating process. In some embodiments, diffusion barriers (e.g., Ni and/or other suitable metal (s)) are formed between Cu pillars 225A-225C and solder bumps 230A-230C, for example, to prevent formation of an intermetallic layer therebetween and/or to prevent the formation of microvoids. UBMs 220A-220C, Cu pillars 225A-225C, and solder bumps 230A-230C can be deposited by electroplating, sputtering, evaporation, other methods, or combinations thereof. After deposition of the various materials for UBMs 220A-220C, Cu pillars 225A-225C, and solder bumps 230A-230C. Patterning processes (e.g., lithography processes and/or etching processes) may be performed to pattern one or more of the various material layers deposited during the bumping process. In some embodiments, a reflow process may be performed after deposition of a solder material to form solder bumps 230A-230C.

Figure 19A:
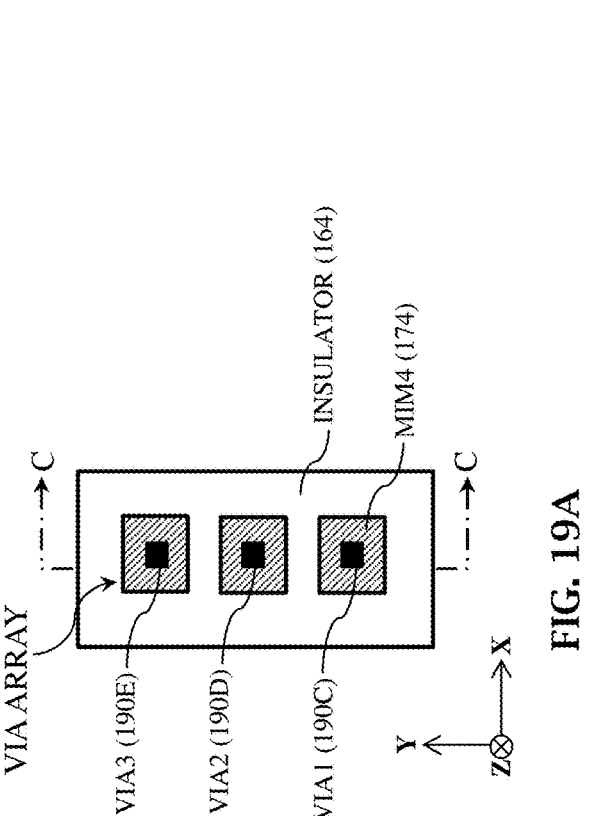
FIG. 19A and FIG. 19B are fragmentary diagrammatic views of a via array that can be implemented in the device of FIGS. 2-18, in portion or entirety, according to some embodiments of the present disclosure.
Figure 19B:
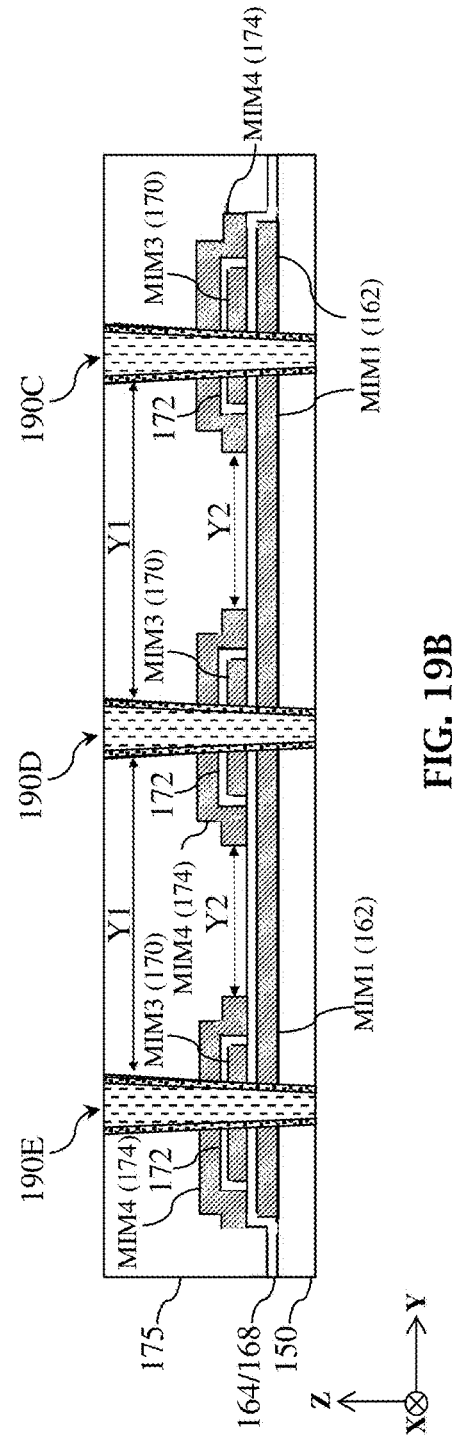

FIG. 19A and FIG. 19B are fragmentary diagrammatic views of a via array that can be implemented in device 100, in portion or entirety, according to some embodiments of the present disclosure. FIG. 19A depicts a top view of a one by three (1×3) via array of device 100, which may correspond with top via array 25 of FIG. 1A, and FIG. 19B is a cross-sectional view of device 100 in a Y-Z plane, such as cross-sectional view of device 100 along a line C-C of FIG. 19A, which may correspond with line C-C of FIG. 1A. FIG. 19A and FIG. 19B have been simplified for the sake of clarity to better understand the inventive concepts of the present disclosure. Additional features can be added in the via array, and some of the features described below can be replaced, modified, or eliminated in other embodiments of the via array.

In FIG. 19A and FIG. 19B, the via array includes a first via (VIA1) (e.g., upper contact 190C), a second via (VIA2) (e.g., an upper contact 190D), and a third via (VIA3) (e.g., an upper contact 190E) arranged and aligned with one another along the y-direction. For example, VIA1 is spaced from VIA2 along the y-direction by a distance Y1, and VIA2 is spaced from VIA3 along the y-direction by distance Y1. VIA1, VIA2, and VIA3 each extend through a respective top conductor layer (i.e., MIM4), a respective middle conductor layer (i.e., MIM3), and a bottom conductor layer (i.e., MIM1). In other words, MIM3 and MIM4 are patterned to provide each via (e.g., contacts 190C-190E) with a respective MIM3 and a respective MIM4 through which it extends. Each respective MIM4 wraps and covers the respective MIM3 and a respective portion of insulator layer 172 therebetween (i.e., insulator layer 172 is patterned to provide each via with a respective portion through which it extends). With such configuration, in the top view (FIG. 19A), VIA1, VIA2, and VIA3 are surrounded by respective MIM4s, and insulator layer 164 surrounds the MIM4s. Extending VIA1, VIA2, and VIA3 through a same number of layers and/or materials can reduce stress and/or cracking.

Incorporating independent MIM3s and/or independent MIM4s into the via array leaves exposed portions of insulator layer 164, such as portions of insulator layer 164 extending between adjacent vias that are not covered by MIM3s and/or MIM4s. Exposed, underlying portions of insulator layer 164 may be damaged during patterning of overlying conductor layers, such as by etching processes used to pattern conductive layers to form MIM3s and/or MIM4s and/or associated with fabrication of a MIM structure as described with reference to FIGS. 8-12. In FIG. 19B, a portion of insulator layer 164 is exposed between MIM4 through which VIA1 extends and MIM4 through which VIA2 extends, and a portion of insulator layer 164 is exposed between MIM4 through which VIA2 extends and MIM4 through which VIA3 extends. Such exposed portions of insulator layer 164 extend a distance Y2 between adjacent vias. In some embodiments, a ratio of Y2 to Y1 (i.e., Y2/Y1) corresponds with an amount of insulator layer 164 exposed between adjacent vias when independent MIM3s and/or independent MIM4s are implemented into the via array. It has been observed that such via configurations can yield ratios that correspond with about 40% to about 80% of insulator layer 164 (and/or other underlying insulator layers) being exposed between adjacent vias of the via array. It has further been observed that an amount of insulator layer exposed increases as dimensions of the via array are reduced (i.e., more compact via arrays expose more insulator layer).

Figure 20A:
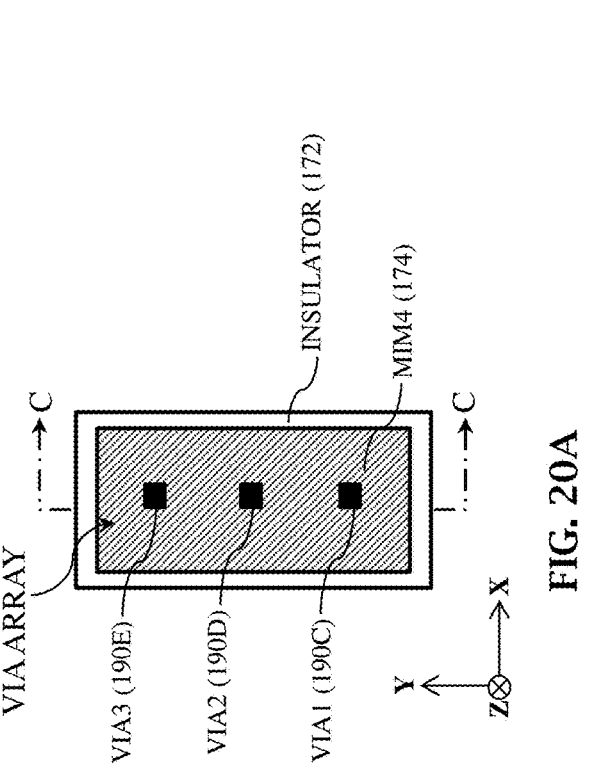
FIG. 20A and FIG. 20B are fragmentary diagrammatic views of another via array that can be implemented in the device of FIGS. 2-18, in portion or entirety, according to some embodiments of the present disclosure.
Figure 20B:
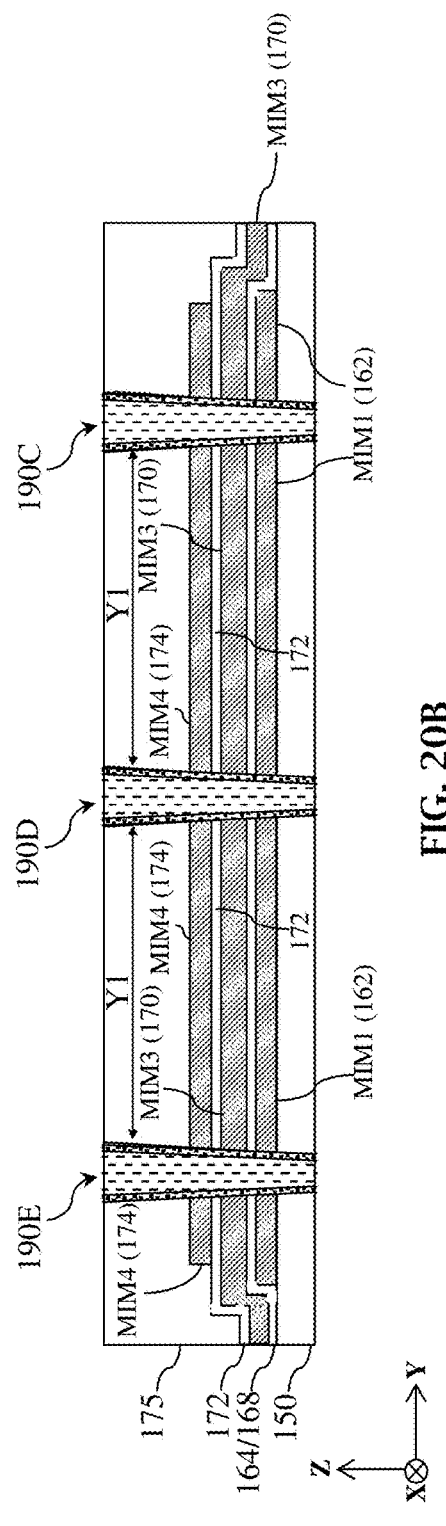

FIG. 20A and FIG. 20B are fragmentary diagrammatic views of another via array that can be implemented in device 100, in portion or entirety, according to some embodiments of the present disclosure. FIG. 20A depicts a top view of a one by three (1×3) via array of device 100, which may correspond with top via array 25 of FIG. 1A, and FIG. 20B is a cross-sectional view of device 100 in a Y-Z plane, such as cross-sectional view of device 100 along a line C-C of FIG. 20A, which may correspond with line C-C of FIG. 1A. FIG. 20A and FIG. 20B have been simplified for the sake of clarity to better understand the inventive concepts of the present disclosure. Additional features can be added in the via array, and some of the features described below can be replaced, modified, or eliminated in other embodiments of the via array.

In FIG. 20A and FIG. 20B, the via array includes VIA1, VIA2, and VIA3 arranged and aligned with one another along the y-direction. VIA1 is spaced from VIA2 along the y-direction by distance Y1, and VIA2 is spaced from VIA3 along the y-direction by distance Y1. Instead of having respective MIM3s and MIM4s, in FIG. 20A and FIG. 20B, MIM3s and MIM4s of vias of the via array are merged together between adjacent vias. For example, VIA1, VIA2, and VIA3 each extend through a top conductor layer (i.e., MIM4), a middle conductor layer (i.e., MIM3), and bottom conductor layer (i.e., MIM1). With such configuration, MIM3 and MIM4 extend distance Y1 between adjacent vias, such that MIM3 covers insulator layer 164 between VIA1 and VIA2 and between VIA2 and VIA3 and MIM4 covers insulator layer 172 between VIA1 and VIA2 and between VIA2 and VIA3. In the top view (FIG. 20A), VIA1, VIA2, and VIA3 are surrounded MIM4 (and/or MIM3), and insulator layer 172 surrounds MIM4.

Figures 21A, 21B:
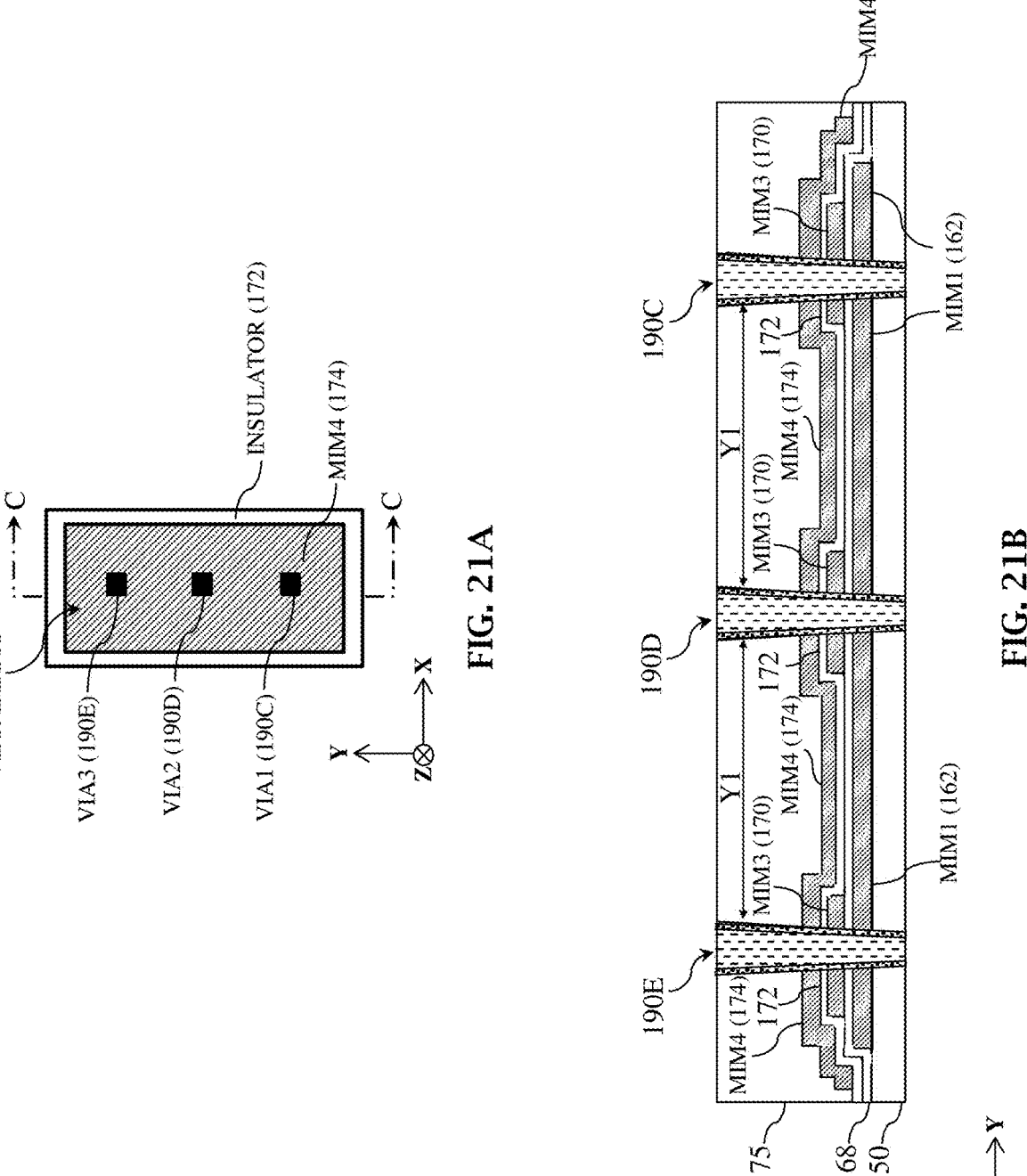
FIG. 21A and FIG. 21B are fragmentary diagrammatic views of yet another via array that can be implemented in the device of FIGS. 2-18, in portion or entirety, according to some embodiments of the present disclosure.

FIG. 21A and FIG. 21B are fragmentary diagrammatic views of another via array that can be implemented in device 100, in portion or entirety, according to some embodiments of the present disclosure. FIG. 21A depicts a top view of a one by three (1×3) via array of device 100, which may correspond with top via array 25 of FIG. 1A, and FIG. 21B is a cross-sectional view of device 100 in a Y-Z plane, such as cross-sectional view of device 100 along a line C-C of FIG. 21A, which may correspond with line C-C of FIG. 1A. The via array of FIG. 21A and FIG. 21B is similar to the via array of FIG. 20A and FIG. 20B, except vias have independent MIM3s in the via array of FIG. 21A and FIG. 21B. In other words, MIM4s of vias of the via array are merged together between adjacent vias, while MIM3s of the vias of the via array are not merged between adjacent vias. For example, VIA1, VIA2, and VIA3 each extend through a top conductor layer (i.e., MIM4), a respective middle conductor layer (i.e., MIM3), and bottom conductor layer (i.e., MIM1). With such configuration, MIM4 extends distance Y1 between adjacent vias, such that MIM4 covers insulator layer 172 between VIA1 and VIA2 and between VIA2 and VIA3. In the top view (FIG. 21A), VIA1, VIA2, and VIA3 are surrounded MIM4, and insulator layer 172 surrounds MIM4. FIG. 21A and FIG. 21B have been simplified for the sake of clarity to better understand the inventive concepts of the present disclosure. Additional features can be added in the via array, and some of the features described below can be replaced, modified, or eliminated in other embodiments of the via array.

Merging MIM3s and/or MIM4s, such as provided in FIG. 20A, FIG. 20B, FIG. 21A, and FIG. 21B, significantly reduces an amount of exposed insulator layer of a MIM structure and thus prevents damage to the MIM structure's insulator layers, such as damage that may result when patterning conductor layers thereof. Reducing and/or preventing damage to the insulator layers can improve reliability and/or performance of the MIM structure. Different embodiments may have different advantages, and no particular advantage is required of any embodiment.

In some embodiments, VIA2 and VIA3 may be dummy vias that are not electrically connected to a voltage and/or external circuitry. In such embodiments, dummy conductor layers (also referred to as dummy conductor pads) may be incorporated into contact/via areas of device 100, such that the contacts/vias extend through a same number of layers and/or materials, which can reduce stress and/or cracking. For example, in some embodiments, MIM3s and MIM4s through which VIA2 and VIA3 extend may be dummy conductor layers, such as dummy middle conductor layers (CDMM) and dummy top conductor layers (CDTM), respectively.

Figure 22:
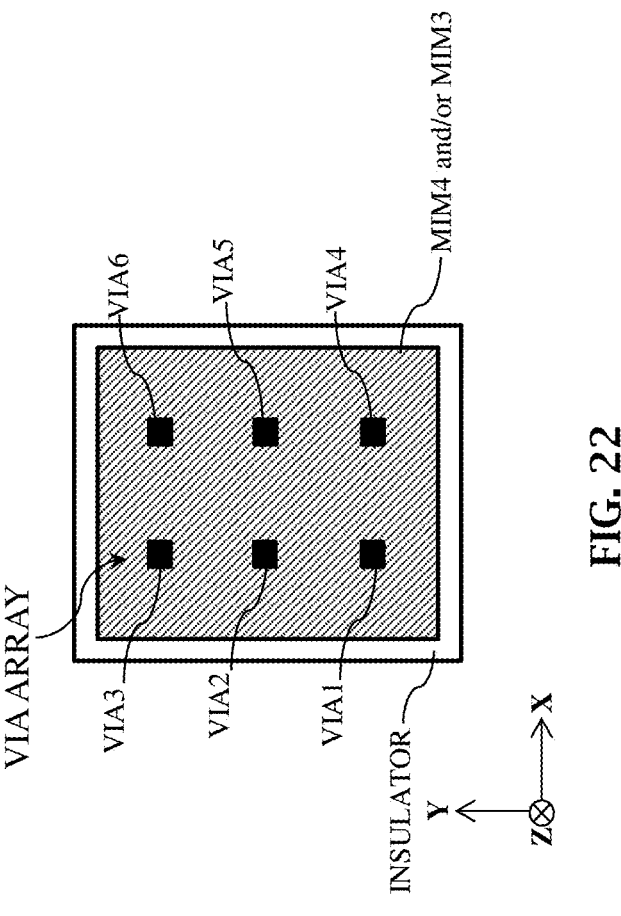
FIG. 22 is a fragmentary diagrammatic top view of yet another via array that can be implemented in the device of FIGS. 2-18, in portion or entirety, according to some embodiments of the present disclosure.

The present disclosure contemplates implementing merging of MIM3s and/or MIM4s (e.g., top conductor layers and/or middle conductor layers of a MIM structure) in via arrays having various configurations. For example, in FIG. 20A and FIG. 21A, the via arrays are one-dimensional arrays. In some embodiments, MIM3s and/or MIM4s are merged in two-dimensional via arrays, such as depicted in FIG. 22. FIG. 22 is a fragmentary diagrammatic top view of a two by three (2×3) via array that can be implemented in device 100, in some embodiments. In the via array, a first column of vias is arranged and aligned along the y-direction, such as VIA1, VIA2, and VIA3, and a second column of vias is arranged and aligned along the y-direction, such as a VIA4, a VIA5, and a VIA6. Vias of the first column are aligned with respective vias of the second column. For example, VIA1, VIA2, and VIA3 are aligned with VIA4, VIA5, and VIA6, respectively, along the x-direction. MIM4 and/or MIM3 surrounds VIA1, VIA2, VIA3, VIA4, VIA5, and VIA6. MIM4 and/or MIM3 extends between adjacent vias, such that MIM4 covers insulator layer 172 and/or MIM3 covers insulator layer 164 between adjacent vias along the y-direction (e.g., between VIA1 and VIA2, between VIA2 and VIA3, between VIA4 and VIA5, between VIA5 and VIA6) and between adjacent vias along the x-direction (e.g., between VIA1 and VIA4, between VIA2 and VIA5, and between VIA3 and VIA6). Further, insulator layer 172 surrounds MIM4. FIG. 22 has been simplified for the sake of clarity to better understand the inventive concepts of the present disclosure. Additional features can be added in the via array, and some of the features described below can be replaced, modified, or eliminated in other embodiments of the via array.

FIG. 23 is a flow chart of a method 300 for fabricating a MIM capacitor structure having improved via reliability according to various aspects of the present disclosure. At block 315, method 300 includes depositing and patterning a first metal layer (e.g., FIG. 1A, FIG. 1B, FIG. 6, FIG. 20A, FIG. 20B, FIG. 21A, FIG. 21B, etc.). A portion of the patterned first metal layer is in a first via region for a first via and a second via region for a second via of the MIM capacitor structure. At block 320, a first insulator layer is deposited over the patterned first metal layer (e.g., FIG. 1A, FIG. 1B, FIG. 7, FIG. 20A, FIG. 20B, FIG. 21A, FIG. 21B, etc.). A portion of the first insulator layer is in the first via region and the second via region. At block 325, method 300 includes depositing and patterning a second metal layer (e.g., FIG. 1A, FIG. 1B, FIG. 8, FIG. 20A, FIG. 20B, FIG. 21A, FIG. 21B, etc.). The patterned second metal layer is over the first insulator layer. At block 330, a second insulator layer is deposited over the patterned second metal layer (e.g., FIG. 1A, FIG. 1B, FIG. 9, FIG. 11, FIG. 20A, FIG. 20B, FIG. 21A, FIG. 21B, etc.). A portion of the second insulator layer is in the first via region and the second via region. At block 335, method 300 includes depositing and patterning a third metal layer (e.g., FIG. 1A, FIG. 1B, FIG. 10, FIG. 12, FIG. 20A, FIG. 20B, FIG. 21A, FIG. 21B, etc.). The patterned third metal layer is over the second insulator layer. A portion of the patterned third metal layer is in the first via region and the second via region, and the portion of the patterned third metal layer covers an area of the second insulator layer between the first via region and the second via region. At block 340, the first via is formed in the first via region and the second via is formed in the second via region (e.g., FIG. 1A, FIG. 1B, FIGS. 13-15, FIG. 20A, FIG. 20B, FIG. 21A, FIG. 21B, etc.). The first via and the second via extends through the portion of the patterned third metal layer, the portion of the second insulator layer, the portion of the first insulator layer, and the portion of the patterned first metal layer. Additional steps can be provided before, during, and after method 300, and some of the steps described can be moved, replaced, or eliminated for additional embodiments of method 300.

The present disclosure provides for many different embodiments. An exemplary device includes a metal-insulator-metal (MIM) capacitor structure disposed over a substrate. The MIM capacitor structure includes a first conductor layer, a second conductor layer, and a third conductor layer. The second conductor layer is between the first conductor layer and the third conductor layer. The MIM capacitor structure further includes a first insulator layer and a second insulator layer. The first insulator layer is between the first conductor layer and the second conductor layer, and the second insulator layer is between the second conductor layer and the third conductor layer. A first via extends vertically through the second insulator layer, the second conductor layer, and the first insulator layer. A second via extends vertically through the third conductor layer, the second insulator layer, the first insulator layer, and the first conductor layer. The second via is spaced laterally from the first via along a first direction. A third via extends vertically through the third conductor layer, the second insulator layer, the first insulator layer, and the first conductor layer. The third via is spaced laterally from the second via along a second direction that is different from the first direction. The third conductor layer extends along the second direction from the third via to the second via.

In some embodiments, the second insulator layer extends along the second direction from the third via to the second via and the third conductor layer covers the second insulator layer between the third via and the second via. In some embodiments, from a top view, the third conductor layer surrounds the second via and the third via and the second insulator layer surrounds the third conductor layer. In some embodiments, the MIM capacitor structure includes a first via array that includes the first via and a second via array that includes the second via and the third via. In some embodiments, the first conductor layer, the second conductor layer, and the third conductor layer include a first metal material; the first via, the second via, and the third via include a second metal material; and the first insulator layer and the second insulator layer include a high-k dielectric material.

In some embodiments, the MIM capacitor structure further includes a fourth conductor layer and a third insulator layer. The fourth conductor layer is between the third conductor layer and the second conductor layer. The third insulator layer is between the third conductor layer and the fourth conductor layer, and the second insulator layer is between the fourth conductor layer and the second conductor layer. The second via and the third via extend vertically through the fourth conductor layer and the third insulator layer. The fourth conductor layer extends along the second direction from the third via to the second via. In some embodiments, the second insulator layer extends along the second direction from the third via to the second via and the fourth conductor layer covers the second insulator layer between the third via and the second via. In some embodiments, the third insulator layer extends along the second direction from the third via to the second via and the third conductor layer covers the third insulator layer between the third via and the second via. In some embodiments, the fourth conductor layer has a first portion through which the second via extends and a second portion through which the third via extends. The first portion is not connected to the second portion along the second direction. In some embodiments, the third insulator layer is between sidewalls of the first portion and the third conductor layer and between sidewalls of the second portion and the third conductor layer.

An exemplary metal-insulator-metal (MIM) capacitor structure includes a capacitor bottom metal layer, a first dielectric layer over the capacitor bottom metal layer, a capacitor middle metal layer over the first dielectric layer, a second dielectric layer over the capacitor middle metal layer, and a capacitor top metal layer over the second dielectric layer. The MIM capacitor structure further includes a metal via array connected to the capacitor top metal layer and the capacitor bottom metal layer. The metal via array has a first metal via and a second metal via. A portion of the capacitor top metal layer covers an area of the second dielectric layer that extends from the first metal via to the second metal via.

In some embodiments, the capacitor top metal layer is a first capacitor top metal layer and the MIM capacitor structure further includes a second capacitor top metal layer over the second dielectric layer and a third dielectric layer over the second capacitor top metal layer. The first capacitor top metal layer is over the second capacitor top metal layer. The third dielectric layer is between the second capacitor top metal layer and the first capacitor top metal layer. In some embodiments, a portion of the second capacitor top metal layer covers the area of the second dielectric layer that extends from the first metal via to the second metal via, and the portion of the first capacitor top metal layer covers an area of the third dielectric layer that extends from the first metal via to the second metal via. In some embodiments, a portion of the second capacitor top metal layer covers a portion of the area of the second dielectric layer that extends from the first metal via to the second metal via.

In some embodiments, from a top view, the portion of the capacitor top metal layer surrounds the first metal via and the second metal via. In some embodiments, the metal via array further includes a third metal via. The first metal via, the second metal via, and the third metal via are arranged to provide a one by three metal via array, and the capacitor top metal layer covers an area of the second dielectric layer that extends from the second metal via to the third metal via. In some embodiments, the metal via array is a two by three metal via array and the capacitor top metal layer covers areas of the second dielectric layer that extends between adjacent metal vias of the two by three metal via array. In some embodiments, the metal via array is a first metal via array, and the MIM capacitor structure may include a second metal via array connected to the capacitor middle metal layer.

An exemplary method for forming a MIM capacitor structure includes depositing and patterning a first metal layer. A portion of the patterned first metal layer is in a first via region for a first via and a second via region for a second via. The method further includes depositing a first insulator layer over the patterned first metal layer. A portion of the first insulator layer is in the first via region and the second via region. The method further includes depositing and patterning a second metal layer. The patterned second metal layer is over the first insulator layer. The method further includes depositing a second insulator layer over the patterned second metal layer. A portion of the second insulator layer is in the first via region and the second via region. The method further includes depositing and patterning a third metal layer. The patterned third metal layer is over the second insulator layer, a portion of the patterned third metal layer is in the first via region and the second via region, and the portion of the patterned third metal layer covers an area of the second insulator layer between the first via region and the second via region. The method further includes forming the first via in the first via region and the second via in the second via region. The first via and the second via extend through the portion of the patterned third metal layer, the portion of the second insulator layer, the portion of the first insulator layer, and the portion of the patterned first metal layer.

In some embodiments, the method includes depositing a third insulator layer over the patterned third metal layer. A portion of the third insulator layer is in the first via region and the second via region. In some embodiments, the method further includes depositing and patterning a fourth metal layer. The patterned fourth metal layer is over the third insulator layer and a portion of the patterned fourth metal layer is in the first via region and the second via region. The first via and the second via further extend through the portion of the patterned fourth metal layer and the portion of the third insulator layer.

In some embodiments, the portion of the first insulator layer is a first portion and the portion of the second insulator layer is a first portion, a second portion of the first insulator layer and a second portion of the second insulator layer are in a third via region for a third via, and a portion of the patterned second metal layer is in the third via region. The method can further include forming the third via in the third via region. The third via extends through the second portion of the second insulator layer, the portion of the patterned second metal layer, and the second portion of the first insulator layer.

An exemplary device structure includes a metal-insulator-metal (MIM) structure disposed over a substrate. The MIM structure includes a first conductor layer, a second conductor layer, and a first dielectric layer between the first conductor layer and the second conductor layer. The MIM structure further includes a first dummy conductor layer, a second dummy conductor layer, and a second dielectric layer between the first dummy conductor layer and the second dummy conductor layer. A first via extends vertically through the first dummy conductor layer, the second dielectric layer, and the second dummy conductor layer. A second via extends vertically through the first dummy conductor layer, the second dielectric layer, and the second dummy conductor layer. The second dummy conductor layer covers an area of the second dielectric layer between the first via and the second via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor structure comprising:
a capacitor bottom metal layer;
a first dielectric layer over the capacitor bottom metal layer;
a capacitor middle metal layer over the first dielectric layer;
a second dielectric layer over the capacitor middle metal layer;
a capacitor top metal layer over the second dielectric layer; and
a metal via array connected to the capacitor top metal layer and the capacitor bottom metal layer, wherein the metal via array has a first metal via and a second metal via, each of the first metal via and the second metal via is connected to both the capacitor top metal layer and the capacitor bottom metal layer, and a portion of the capacitor top metal layer covers an area of the second dielectric layer that extends from the first metal via to the second metal via, wherein the portion of the capacitor top metal layer abuts both the first metal via and the second metal via.

2. The MIM capacitor structure of claim 1, wherein, from a top view, the portion of the capacitor top metal layer surrounds the first metal via and the second metal via.

3. The MIM capacitor structure of claim 1, wherein the capacitor top metal layer is a first capacitor top metal layer and the MIM capacitor structure further comprises:
a second capacitor top metal layer over the second dielectric layer; and
a third dielectric layer over the second capacitor top metal layer, wherein the first capacitor top metal layer is over the second capacitor top metal layer and the third dielectric layer is between the second capacitor top metal layer and the first capacitor top metal layer.

4. The MIM capacitor structure of claim 3, wherein:
a portion of the second capacitor top metal layer covers the area of the second dielectric layer that extends from the first metal via to the second metal via; and
the portion of the first capacitor top metal layer covers an area of the third dielectric layer that extends from the first metal via to the second metal via.

5. The MIM capacitor structure of claim 3, wherein:
a portion of the second capacitor top metal layer covers a portion of the area of the second dielectric layer that extends from the first metal via to the second metal via; and
the portion of the first capacitor top metal layer covers an area of the third dielectric layer that extends from the first metal via to the second metal via.

6. The MIM capacitor structure of claim 1, wherein:
the metal via array further includes a third metal via;
the first metal via, the second metal via, and the third metal via are arranged to provide a one by three metal via array; and
the capacitor top metal layer covers an area of the second dielectric layer that extends from the second metal via to the third metal via.

7. The MIM capacitor structure of claim 1, wherein the metal via array is a two by three metal via array and the capacitor top metal layer covers areas of the second dielectric layer that extends between adjacent metal vias of the two by three metal via array.

8. The MIM capacitor structure of claim 1, wherein the metal via array is a first metal via array, the MIM capacitor structure further comprising a second metal via array connected to the capacitor middle metal layer.

9. A metal-insulator-metal (MIM) capacitor structure comprising:
a first conductor layer;
a first insulator layer over the first conductor layer;
a second conductor layer over the first insulator layer;
a second insulator layer over the second conductor layer;
a third conductor layer over the second insulator layer; and
a via array connected to the first conductor layer and the third conductor layer, wherein the via array has a first via and a second via and a portion of the third conductor layer extends from the first via to the second via without interruption, such that the portion of the third conductor layer covers an entire area of the second insulator layer between and extending from the first via to the second via, and further wherein both the first via and the second via extend from above the third conductor layer to below the first conductor layer.

10. The MIM capacitor structure of claim 9, wherein each of the first insulator layer and the second insulator layer includes an aluminum oxide layer disposed between a first zirconium oxide layer and a second zirconium oxide layer.

11. The MIM capacitor structure of claim 9, further comprising:
a third insulator layer over the third conductor layer;
a fourth conductor layer over the third insulator layer; and
wherein a portion of the fourth conductor layer covers an area of the third insulator layer that extends from the first via to the second via.

12. The MIM capacitor structure of claim 11, wherein the first via and the second via extend through the fourth conductor layer and the third conductor layer.

13. The MIM capacitor structure of claim 9, wherein the first via and the second via extend through the first conductor layer and the third conductor layer.

14. The MIM capacitor structure of claim 9, further comprising a fourth conductor layer disposed between the third conductor layer and the first conductor layer, wherein the via array is connected to the fourth conductor layer and the fourth conductor layer does not cover the area of the second insulator layer that extends from the first via to the second via.

15. The MIM capacitor structure of claim 9, wherein:
the via array further includes a third via; and
another portion of the third conductor layer covers an area of the second insulator layer that extends from the second via to the third via.

16. The MIM capacitor structure of claim 9, wherein the via array is a first via array, the MIM capacitor structure further comprising a second via array connected to the second conductor layer.

17. A metal-insulator-metal (MIM) capacitor structure comprising:
a capacitor bottom metal layer;
a first dielectric layer over the capacitor bottom metal layer;
a capacitor middle metal layer over the first dielectric layer;
a second dielectric layer over the capacitor middle metal layer;
a capacitor top metal layer over the second dielectric layer; and
a metal via array connected to the capacitor top metal layer and the capacitor bottom metal layer, wherein:
the metal via array has a first metal via and a second metal via that extend through the capacitor top metal layer, the second dielectric layer, the first dielectric layer, and the capacitor bottom metal layer, and a portion of the capacitor top metal layer extends from the first metal via to the second metal via, such that the portion of the capacitor top metal layer covers an entire area of a portion of the second dielectric layer between and extending from the first metal via to the second metal via.

18. The MIM capacitor structure of claim 17, wherein the capacitor top metal layer is a first capacitor top metal layer and the MIM capacitor structure further includes:
a third dielectric layer disposed over the first capacitor top metal layer;
a second capacitor top metal layer disposed over the third dielectric layer;
wherein the first metal via and the second metal via extend through the second capacitor top metal layer and the third dielectric layer; and
wherein a portion of the second capacitor top metal layer covers an area of the third dielectric layer that extends from the first metal via to the second metal via.

19. The MIM capacitor structure of claim 17, wherein the capacitor top metal layer is a first capacitor top metal layer and the MIM capacitor structure further includes:
a second capacitor top metal layer disposed over the second dielectric layer;
a third dielectric layer disposed over the second capacitor top metal layer, wherein the first capacitor top metal layer is disposed over the third dielectric layer;
wherein the first metal via and the second metal via extend through the second capacitor top metal layer and the third dielectric layer; and
wherein the first capacitor top metal layer covers an area of the third dielectric layer that extends from the first metal via to the second metal via.

20. The MIM capacitor structure of claim 19, wherein the third dielectric layer and the first capacitor top metal layer wrap corners of the second capacitor top metal layer.

* * * * *